United States Patent
Abu-Surra et al.

(10) Patent No.: US 10,523,364 B2
(45) Date of Patent: Dec. 31, 2019

(54) CHANNEL CODING FRAMEWORK FOR 802.11AY AND LARGER BLOCK-LENGTH LDPC CODES FOR 11AY WITH 2-STEP LIFTING MATRICES AND IN-PLACE PROPERTY

(71) Applicant: Samsung Electronics Co., Ltd, Suwon-si (KR)

(72) Inventors: Shadi Abu-Surra, Plano, TX (US); Eran Pisek, Plano, TX (US); Thomas Henige, Plano, TX (US); Rakesh Taori, McKinney, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 175 days.

(21) Appl. No.: 15/294,612

(22) Filed: Oct. 14, 2016

(65) Prior Publication Data

US 2017/0134050 A1    May 11, 2017

Related U.S. Application Data

(60) Provisional application No. 62/350,582, filed on Jun. 15, 2016, provisional application No. 62/251,823, filed on Nov. 6, 2015.

(51) Int. Cl.
*H04L 1/00* (2006.01)
*H04B 7/0413* (2017.01)
(Continued)

(52) U.S. Cl.
CPC ........ *H04L 1/0045* (2013.01); *H03M 13/036* (2013.01); *H03M 13/114* (2013.01);
(Continued)

(58) Field of Classification Search
CPC .............. H04B 7/0413; H03M 13/616; H03M 13/1137; H03M 13/114; H03M 13/1154;
(Continued)

(56) References Cited

U.S. PATENT DOCUMENTS

| | | | |
|---|---|---|---|
| 8,560,911 B2 | 10/2013 | Abu-Surra et al. | |
| 2011/0066916 A1* | 3/2011 | Abu-Surra | H03M 13/03 714/752 |
| 2014/0098912 A1* | 4/2014 | Yin | H04B 7/0417 375/345 |
| 2014/0229789 A1* | 8/2014 | Richardson | H03M 13/036 714/752 |

(Continued)

OTHER PUBLICATIONS

IEEE 802.11ad standard spec., Part 11: Wireless LAN medium access control (MAC) and physical layer (PHY) Specifications, Amendment 3: Enhancements for very high throughput in the 60 GHz Band, http://standards.ieee.org/getieee802/download/802.11ad-2012.pdf, Mar. 29, 2012, 500 pgs.

(Continued)

*Primary Examiner* — Guy J Lamarre

(57) ABSTRACT

Methods and apparatuses for coding a codeword. An apparatus for decoding the codeword includes a memory configured to receive the codeword encoded based on a low-density parity check (LDPC) code H-matrix and a two-step lifting matrix and processing circuitry configured to decode the received codeword. An apparatus for encoding the codeword includes memory configured to store information bits to be encoded into the codeword and processing circuitry configured to encode the codeword based on based on a LDPC code H-matrix and a two-step lifting matrix. A code length of the LDPC code H-matrix lifted by the two-step lifting matrix is an integer multiple of 672 bits. The LDPC code block H-matrix may be an IEEE 802.11ad standard LDPC coding matrix. The two-step lifting matrix can be one of a plurality of two-step lifting matrices to generate a family of LDPC codes.

18 Claims, 24 Drawing Sheets

(51) Int. Cl.
*H03M 13/00* (2006.01)
*H03M 13/03* (2006.01)
*H03M 13/11* (2006.01)
*H03M 13/27* (2006.01)

(52) U.S. Cl.
CPC ...... *H03M 13/116* (2013.01); *H03M 13/1137* (2013.01); *H03M 13/1154* (2013.01); *H03M 13/27* (2013.01); *H03M 13/616* (2013.01); *H03M 13/635* (2013.01); *H03M 13/6516* (2013.01); *H03M 13/6527* (2013.01); *H04B 7/0413* (2013.01); *H04L 1/0041* (2013.01); *H04L 1/0057* (2013.01)

(58) Field of Classification Search
CPC .. H03M 13/116; H03M 13/27; H03M 13/635; H03M 13/6516; H03M 13/6527; H03M 13/036; H04L 1/0045; H04L 1/0041; H04L 1/0057
See application file for complete search history.

(56) References Cited

U.S. PATENT DOCUMENTS

| | | | |
|---|---|---|---|
| 2016/0013931 A1* | 1/2016 | Pisek | H04L 9/0631 380/28 |
| 2016/0094246 A1* | 3/2016 | Vasista Srinivasan Ranganathan | H03M 13/1171 714/776 |
| 2016/0164537 A1* | 6/2016 | Pisek | H03M 13/116 714/755 |
| 2016/0173132 A1* | 6/2016 | Cho | H03M 13/1154 714/752 |

OTHER PUBLICATIONS

Thomas Henige, Shadi Abu-Surra, Eran Pisek, "High-Throughput Low-Power LDPC Decoder and Code Design," in IEEE GlobeCom Conference, Dec. 2011, 6 pgs.

\* cited by examiner

FIGURE 7A

| 35 | 19 | 41 | 22 | 40 | 41 | 39 | 6  | 28 | 18 | 17 | 3  | 28 | -1 | -1 | -1 |
|----|----|----|----|----|----|----|----|----|----|----|----|----|----|----|----|
| 29 | 30 | 0  | 8  | 33 | 22 | 17 | 4  | 27 | 28 | 20 | 27 | 24 | 23 | -1 | -1 |
| 37 | 31 | 18 | 23 | 11 | 21 | 6  | 20 | 32 | 9  | 12 | 29 | -1 | 0  | 13 | -1 |
| 25 | 22 | 4  | 34 | 31 | 3  | 14 | 15 | 4  | -1 | 14 | 18 | 13 | 13 | 22 | 24 |

705 802.11ad matrix

FIGURE 7B

| 0 | 0 | 1 | 1 | 1 | 1 | 0 | 0 | 0 | 0  | 1 | 1 | 0  | -1 | -1 | -1 |
|---|---|---|---|---|---|---|---|---|----|---|---|----|----|----|----|
| 1 | 1 | 1 | 1 | 1 | 0 | 1 | 0 | 1 | 0  | 0 | 1 | 1  | 0  | -1 | -1 |
| 0 | 0 | 0 | 0 | 0 | 0 | 0 | 0 | 0 | 1  | 0 | 1 | -1 | 1  | 0  | -1 |
| 1 | 0 | 1 | 1 | 0 | 1 | 1 | 1 | 1 | -1 | 1 | 0 | 1  | 0  | 0  | 0  |

| 1 | 2 | 1 | 1 | 2 | 1 | 1 | 0 | 1 | 1  | 2 | 0  | 0  | -1 | -1 | -1 |
|---|---|---|---|---|---|---|---|---|----|---|----|----|----|----|----|
| 2 | 2 | 2 | 2 | 0 | 2 | 1 | 2 | 2 | 1  | 0 | 2  | 2  | 0  | -1 | -1 |
| 0 | 1 | 1 | 2 | 2 | 1 | 0 | 0 | 1 | 0  | 1 | -1 | -1 | 2  | 0  | -1 |
| 2 | 1 | 2 | 1 | 1 | 1 | 0 | 2 | 1 | -1 | 0 | 1  | 1  | 0  | 2  | 0  |

715 N=2016 $Z_p=3$

FIGURE 8A — 805 802.11ad matrix

Rate 1/2 Codes

| 40 | -1 | 38 | -1 | 13 | 5 | 18 | -1 | -1 | -1 | -1 | -1 | -1 |
|---|---|---|---|---|---|---|---|---|---|---|---|---|
| 34 | -1 | 35 | -1 | 27 | -1 | 2 | 1 | -1 | -1 | -1 | -1 | -1 |
| -1 | 36 | -1 | 31 | -1 | -1 | -1 | 10 | 41 | -1 | -1 | -1 | -1 |
| -1 | 27 | -1 | 18 | -1 | 7 | 20 | -1 | -1 | 15 | 6 | -1 | -1 |
| 35 | -1 | 41 | -1 | 40 | 12 | -1 | -1 | -1 | -1 | 3 | 28 | -1 |
| 29 | -1 | 0 | -1 | -1 | -1 | 39 | 28 | -1 | -1 | 27 | -1 | 13 |
| -1 | -1 | -1 | 22 | -1 | 21 | -1 | -1 | 4 | 12 | -1 | -1 | 0 |
| -1 | 31 | -1 | 23 | -1 | 22 | -1 | 4 | 20 | -1 | -1 | -1 | -1 |
| -1 | 22 | -1 | 34 | 31 | -1 | 14 | -1 | -1 | -1 | -1 | 13 | 22 | 24 |

905
802.11ad
matrix

CHANNEL CODING FRAMEWORK FOR 802.11AY AND LARGER BLOCK-LENGTH LDPC CODES FOR 11AY WITH 2-STEP LIFTING MATRICES AND IN-PLACE PROPERTY

CROSS-REFERENCE TO RELATED APPLICATION AND CLAIM OF PRIORITY

This application claims priority under 35 U.S.C. § 119(e) to U.S. Provisional Patent Application No. 62/350,582 filed on Jun. 15, 2016 and to U.S. Provisional Patent Application No. 62/251,823 filed on Nov. 6, 2015. The above-identified provisional patent applications are hereby incorporated by reference in its entirety.

TECHNICAL FIELD

This disclosure relates generally to telecommunication systems. More specifically, this disclosure relates to a Channel Coding Framework for 802.11ay (also referred herein as "11ay") and larger block-length LDPC codes for 11ay with two-step lifting matrices and in-place property.

BACKGROUND

In information theory, a low-density parity-check (LDPC) code is an error correcting code for transmitting a message over a noisy transmission channel. LDPC codes are a class of linear block codes. While LDPC and other error correcting codes cannot guarantee perfect transmission, the probability of lost information can be made as small as desired. LDPC was the first code to allow data transmission rates close to the theoretical maximum known as the Shannon Limit. LDPC codes can perform with 0.0045 dB of the Shannon Limit. LDPC was impractical to implement when developed in 1963. Turbo codes, discovered in 1993, became the coding scheme of choice in the late 1990s. Turbo codes are used for applications such as deep-space satellite communications. LDPC requires complex processing but is the most efficient scheme discovered as of 2007. LDPC codes can yield a large minimum distance (hereinafter "$d_{min}$") and reduce decoding complexity.

The IEEE 802.11ad standard (also referred herein as "11ad") enables communication in frequencies around 60 GHz for very high throughput. The IEEE 802.11ad standard also defines four LDPC matrices, each corresponding to a code rate 1/2, code rate 5/8, code rate 3/4, and code rate 13/16, respectively.

SUMMARY

This disclosure provides systems and methods for a Channel Coding Framework for 802.11ay and Larger block-length LDPC codes for 11ay with two-step lifting matrices and in-place property.

In an embodiment, an apparatus for decoding a codeword is provided. The apparatus includes a memory configured to receive the codeword encoded based on a low-density parity check (LDPC) code H-matrix and a two-step lifting matrix and processing circuitry configured to decode the received codeword. A code length of the LDPC code H-matrix lifted by the two-step lifting matrix is an integer multiple of 672 bits.

In another embodiment, a method for decoding a codeword is provided. The method includes receiving the codeword encoded based on a low-density parity check (LDPC) code H-matrix and a two-step lifting matrix and decoding the received codeword. A code length of the LDPC code H-matrix lifted by the two-step lifting matrix is an integer multiple of 672 bits.

In a yet another embodiment, an apparatus for encoding a codeword is provided. The apparatus includes memory configured to store information bits to be encoded into the codeword and processing circuitry configured to encode the codeword based on a LDPC code H-matrix and a two-step lifting matrix. A code length of the LDPC code H-matrix lifted by the two-step lifting matrix is an integer multiple of 672 bits.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable medium. The ten is "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of this disclosure and its advantages, reference is now made to the following description, taken in conjunction with the accompanying drawings, in which:

FIG. 7A illustrates an LDPC code base matrix according to the code rate 3/4 according to this disclosure;

FIG. 7B illustrates a length-1344 two-step lifting matrix according to the code rate 3/4 according to this disclosure;

FIG. 7C illustrates a length-2016 two-step lifting matrix according to the code rate 3/4 according to this disclosure;

FIG. 8A illustrates an LDPC code base matrix according to the code rate 5/8 according to this disclosure;

FIG. 8B illustrates a length-1344 two-step lifting matrix according to the code rate 5/8 according to this disclosure;

FIG. 8C illustrates a length-2016 two-step lifting matrix according to the code rate 5/8 according to this disclosure;

FIG. 9A illustrates an LDPC code base matrix according to the code rate 1/2 according to this disclosure;

FIG. 9B illustrates a length-1344 two-step lifting matrix according to the code rate 1/2 according to this disclosure;

FIG. 9C illustrates a length-2016 two-step lifting matrix according to the code rate 1/2 according to this disclosure;

DETAILED DESCRIPTION

FIGS. 1 through 29, discussed below, and the various embodiments used to describe the principles of this disclosure in this patent document are by way of illustration only and should not be construed in any way to limit the scope of the disclosure. Those skilled in the art will understand that the principles of this disclosure may be implemented in any suitably arranged wireless communication system.

The following documents and standards descriptions are hereby incorporated by reference into the present disclosure as if fully set forth herein: (i) U.S. Pat. No. 8,560,911 titled "System and method for structured LDPC code family" (hereinafter "REF1").

Figure 1:
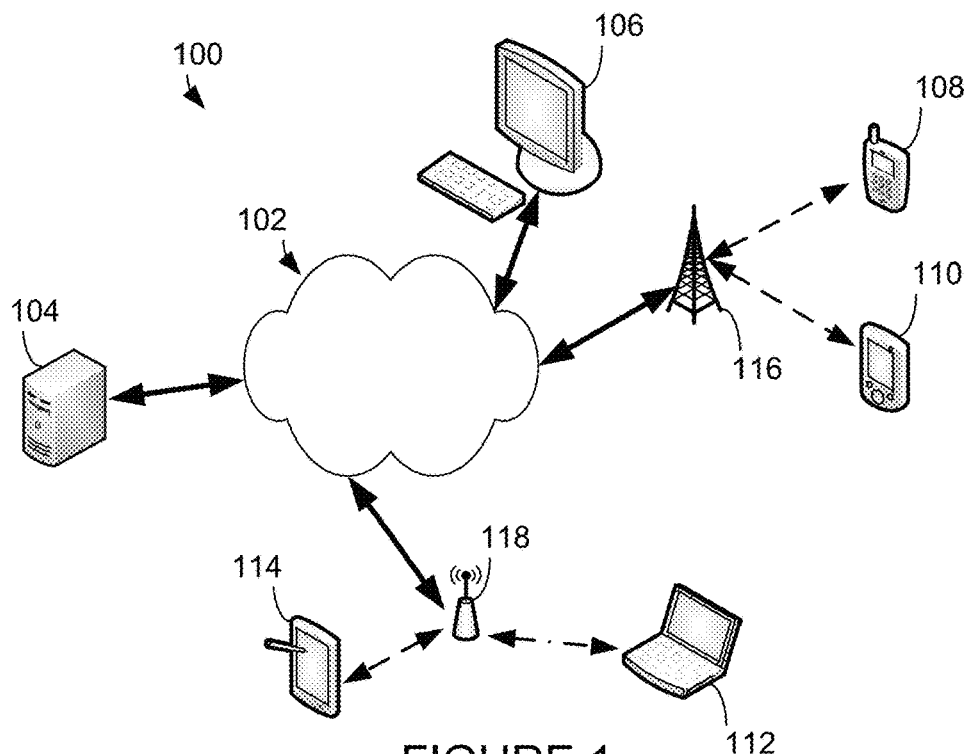
FIG. 1 illustrates an example computing system according to this disclosure.

FIG. 1 illustrates an example computing system 100 according to this disclosure. The embodiment of the computing system 100 shown in FIG. 1 is for illustration only. Other embodiments of the computing system 100 could be used without departing from the scope of this disclosure.

As shown in FIG. 1, the system 100 includes a network 102, which facilitates communication between various components in the system 100. For example, the network 102 may communicate Internet Protocol (IP) packets, frame relay frames, Asynchronous Transfer Mode (ATM) cells, or other information between network addresses. The network 102 may include one or more local area networks (LANs), metropolitan area networks (MANs), wide area networks (WANs), all or a portion of a global network such as the Internet, or any other communication system or systems at one or more locations.

The network 102 facilitates communications between at least one server 104 and various client devices 106-114. Each server 104 includes any suitable computing or processing device that can provide computing services for one or more client devices. Each server 104 could, for example, include one or more processing devices, one or more memories storing instructions and data, and one or more network interfaces facilitating communication over the network 102.

Each client device 106-114 represents any suitable computing or processing device that interacts with at least one server or other computing device(s) over the network 102. In this example, the client devices 106-114 include a desktop computer 106, a mobile telephone or smartphone 108, a personal digital assistant (PDA) 110, a laptop computer 112, and a tablet computer 114. However, any other or additional client devices could be used in the computing system 100.

In this example, some client devices 108-114 communicate indirectly with the network 102. For example, the client devices 108-110 communicate via one or more base stations 108, such as cellular base stations or eNodeBs. Also, the client devices 112-114 communicate via one or more wireless access points 118, such as Institute of Electrical and Electronics Engineers (IEEE) 802.11 wireless access points. Note that these are for illustration only and that each client device could communicate directly with the network 102 or indirectly with the network 102 via any suitable intermediate device(s) or network(s).

As described in more detail below, the system 100 includes wireless communication using an IEEE 802.11ay standard (also referred herein as "11ay"). That is, the embodiments of the present disclosure can be incorporated into the specification of IEEE 802.11ay standard. Embodiments of the present disclosure support channel bonding and MIMO in 11ay orthogonal frequency-division multiplexing (OFDM) physical layer (PHY), and provide an enhanced channel coding scheme to the 11ay, which can provide "significant" packet error rate (PER) performance improvement. In order to provide the significant PER performance improvement, embodiments of the present disclosure provide any one or combination of: (1) interleaving over the full bandwidth in case of channel bonding, (2) extended LDPC codes that are longer than 672-bits, (3) new Spatially Coupled LDPC (SC-LDPC) codes, and (4) joint or independent coding for multiple-input multiple-output (MIMO) streams.

As a specific example, the server 104, the client devices 106-114, and wireless access point 118 can send and receive extended code blocks, which correspond to an LPDC block based on IEEE 802.11ad standard LDPC code matrices. The extended block is a newly designed code with two-step lifting and in-place properties, according to this disclosure. Herein, the term "in-place" means pre-defined.

The embodiments of this disclosure provide decoder hardware architectures for the implementing the newly designed code with two-step lifting and in-place properties. For example, the server 104, the client devices 106-114, and wireless access point 118 can include the decoder hardware architectures according to this disclosure.

The embodiments of this disclosure provide various methods of mapping code block bits to a channel, and the channel includes multiple sub-channels bonded or otherwise aggregated to include at least 672 subcarriers. As an example, a transmitting device within the system 100 can bond portions of the entire bandwidth of the device to form a channel that includes two times (2×) the number of subcarriers as an 11ad channel and that spans at least two times the bandwidth of an 11ad channel. Similarly, a receiving device can include receiver configured to receive the channel that includes the double quantity of subcarrier, and include a decoder hardware architecture for decoding according to the newly designed code with two-step lifting and in-place properties. A first of the various methods of mapping includes: mapping a first code block (e.g., 672-bit codeword) over a first of the two bonded sub-channels, and mapping a second code block over (e.g., 672-bits codeword) a second of the two bonded sub-channels, in which case the first and second code blocks are independently coded using 11ad codes. A second of the various methods of mapping includes: interleaving bits of a first code block and bits of a second code block over a first of the two bonded sub-channels, interleaving bits of the first and second code blocks over a second of the two bonded sub-channels, in which case the first and second code blocks are independently coded using 11ad codes. A third of the various methods of mapping includes: interleaving bits of a first code block segment (namely, first 672-bits within a codeword) and bits of a second code block segment (namely, second 672-bits within the same codeword) over a first of the two bonded sub-channels, interleaving bits of the first and second code block segments over a second of the two bonded sub-channels, in which case the code block (including the first and second code block segments) is coded using length-1344 or length-2016 LDPC codes according to this disclosure, which are designed based the 11ad codes. Of course, these mapping and interleaving functions may be performed by an encoder for decoding by a decoder performing analogous demapping and deinterleaving.

Although FIG. 1 illustrates one example of a computing system 100, various changes may be made to FIG. 1. For example, the system 100 could include any number of each component in any suitable arrangement. In general, computing and communication systems come in a wide variety of configurations, and FIG. 1 does not limit the scope of this disclosure to any particular configuration. While FIG. 1 illustrates one operational environment in which various features disclosed in this patent document can be used, these features could be used in any other suitable system.

Figure 2:
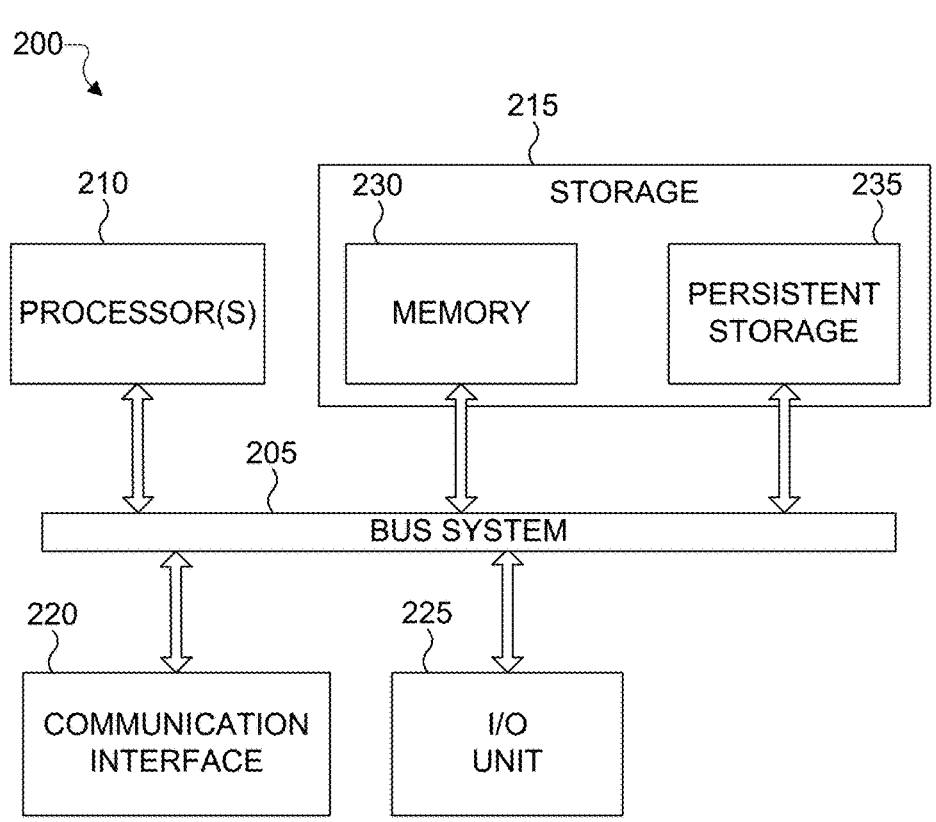
FIGS. 2 and 3 illustrate example devices in a computing system according to this disclosure.
Figure 3:
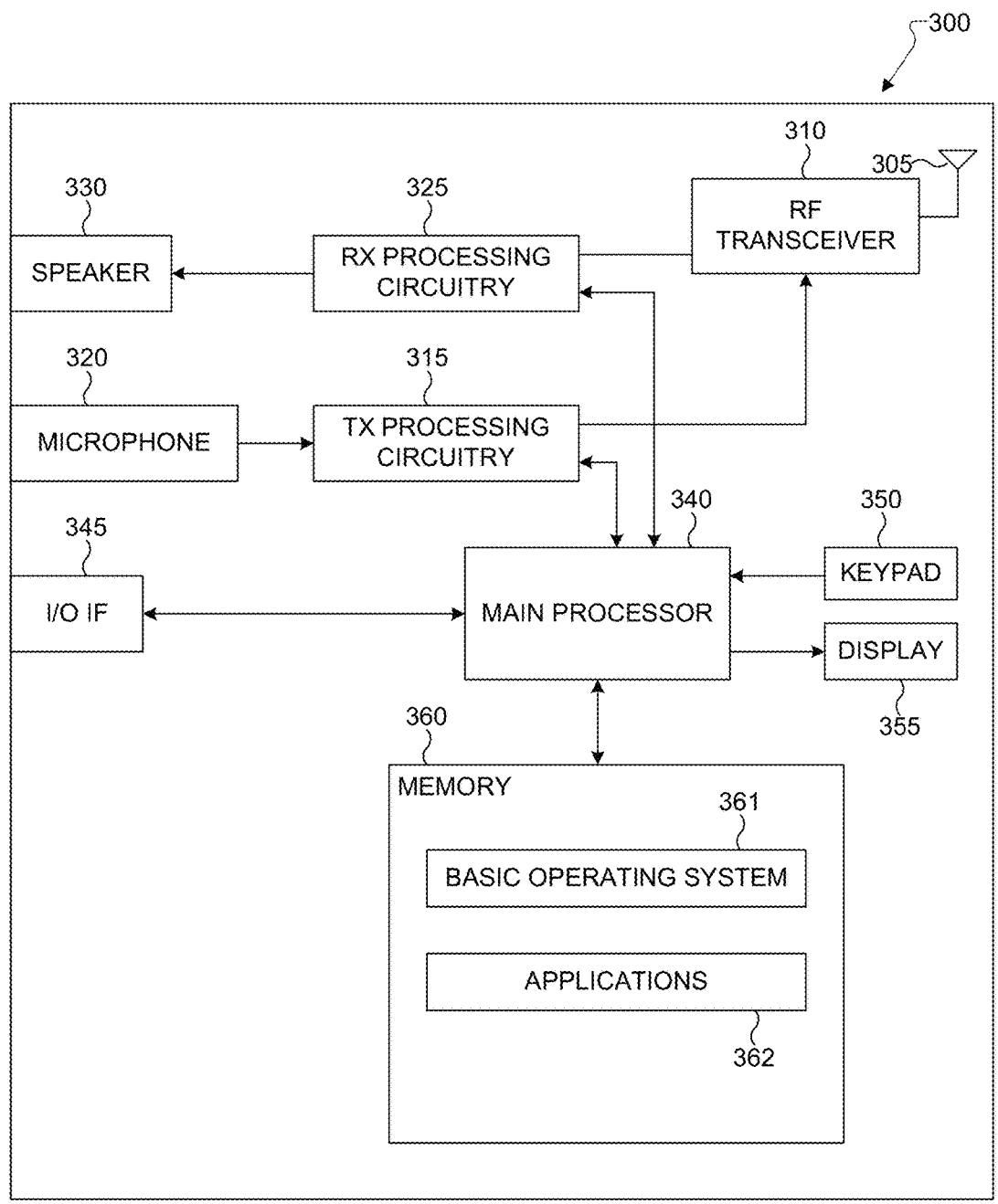

FIGS. 2 and 3 illustrate example devices in a computing system according to this disclosure. In particular, FIG. 2 illustrates an example server 200, and FIG. 3 illustrates an example client device 300. The server 200 could represent the server 104 in FIG. 1, and the client device 300 could represent one or more of the client devices 106-114 in FIG. 1.

As shown in FIG. 2, the server 200 includes a bus system 205, which supports communication between at least one processing device 210, at least one storage device 215, at least one communications unit 220, and at least one input/output (I/O) unit 225.

The processing device 210 executes instructions that may be loaded into a memory 230. The processing device 210 may include any suitable number(s) and type(s) of processors or other devices in any suitable arrangement. Example types of processing devices 210 include microprocessors, microcontrollers, digital signal processors, field programmable gate arrays, application specific integrated circuits, and discreet circuitry.

The memory 230 and a persistent storage 235 are examples of storage devices 215, which represent any structure(s) capable of storing and facilitating retrieval of information (such as data, program code, and/or other suitable information on a temporary or permanent basis). The memory 230 may represent a random access memory or any other suitable volatile or non-volatile storage device(s). The persistent storage 235 may contain one or more components or devices supporting longer-term storage of data, such as a ready only memory, hard drive, Flash memory, or optical disc.

The communications unit 220 supports communications with other systems or devices. For example, the communications unit 220 could include a network interface card or a wireless transceiver facilitating communications over the network 102. The communications unit 220 may support communications through any suitable physical or wireless communication link(s).

The I/O unit 225 allows for input and output of data. For example, the I/O unit 225 may provide a connection for user input through a keyboard, mouse, keypad, touchscreen, or other suitable input device. The I/O unit 225 may also send output to a display, printer, or other suitable output device.

Note that while FIG. 2 is described as representing the server 104 of FIG. 1, the same or similar structure could be used in one or more of the client devices 106-114. For example, a laptop or desktop computer could have the same or similar structure as that shown in FIG. 2.

As shown in FIG. 3, the client device 300 includes an antenna 305, a radio frequency (RF) transceiver 310, transmit (TX) processing circuitry 315, a microphone 320, and receive (RX) processing circuitry 325. The client device 300 also includes a speaker 330, a main processor 340, an input/output (I/O) interface (IF) 345, a keypad 350, a display 355, and a memory 360. The memory 360 includes a basic operating system (OS) program 361 and one or more applications 362.

The RF transceiver 310 receives, from the antenna 305, an incoming RF signal transmitted by another component in a system. The RF transceiver 310 down-converts the incoming RF signal to generate an intermediate frequency (IF) or baseband signal. The IF or baseband signal is sent to the RX processing circuitry 325, which generates a processed baseband signal by filtering, decoding, and/or digitizing the baseband or IF signal. The RX processing circuitry 325 transmits the processed baseband signal to the speaker 330 (such as for voice data) or to the main processor 340 for further processing (such as for web browsing data).

The TX processing circuitry 315 receives analog or digital voice data from the microphone 320 or other outgoing baseband data (such as web data, e-mail, or interactive video game data) from the main processor 340. The TX processing circuitry 315 encodes, multiplexes, and/or digitizes the outgoing baseband data to generate a processed baseband or IF signal. The RF transceiver 310 receives the outgoing processed baseband or IF signal from the TX processing circuitry 315 and up-converts the baseband or IF signal to an RF signal that is transmitted via the antenna 305.

The main processor 340 can include one or more processors or other processing devices and execute the basic OS program 361 stored in the memory 360 in order to control the overall operation of the client device 300. For example, the main processor 340 could control the reception of forward channel signals and the transmission of reverse channel signals by the RF transceiver 310, the RX processing circuitry 325, and the TX processing circuitry 315 in accordance with well-known principles. In some embodiments, the main processor 340 includes at least one microprocessor or microcontroller.

The main processor 340 is also capable of executing other processes and programs resident in the memory 360, such as operations for implementing a Channel Coding Framework for 802.11ay and Larger block-length LDPC codes for 11ay with two-step lifting matrices and in-place property. The main processor 340 can move data into or out of the memory 360 as required by an executing process. In some embodiments, the main processor 340 is configured to execute the applications 362 based on the OS program 361 or in response to signals received from external devices or an operator. The main processor 340 is also coupled to the I/O interface 345, which provides the client device 300 with the ability to connect to other devices such as laptop computers and handheld computers. The I/O interface 345 is the communication path between these accessories and the main controller 340.

The main processor 340 is also coupled to the keypad 350 and the display unit 355. The operator of the client device 300 can use the keypad 350 to enter data into the client device 300. The display 355 may be a liquid crystal display or other display capable of rendering text and/or at least limited graphics, such as from web sites.

The memory 360 is coupled to the main processor 340. Part of the memory 360 could include a random access memory (RAM), and another part of the memory 360 could include a Flash memory or other read-only memory (ROM).

As described in more detail below, transmitting and receiving devices of the system 100 implement a Channel Coding Framework for 802.11ay and larger block-length LDPC codes for 11ay with two-step lifting matrices and in-place property.

Although FIGS. 2 and 3 illustrate examples of devices in a computing system, various changes may be made to FIGS. 2 and 3. For example, various components in FIGS. 2 and 3 could be combined, further subdivided, or omitted and additional components could be added according to particular needs. As a particular example, the main processor 340 could be divided into multiple processors, such as one or more central processing units (CPUs) and one or more graphics processing units (GPUs). Also, while FIG. 3 illustrates the client device 300 configured as a mobile telephone or smartphone, client devices could be configured to operate as other types of mobile or stationary devices. In addition, as with computing and communication networks, client devices and servers can come in a wide variety of configurations, and FIGS. 2 and 3 do not limit this disclosure to any particular client device or server.

Figure 4A:
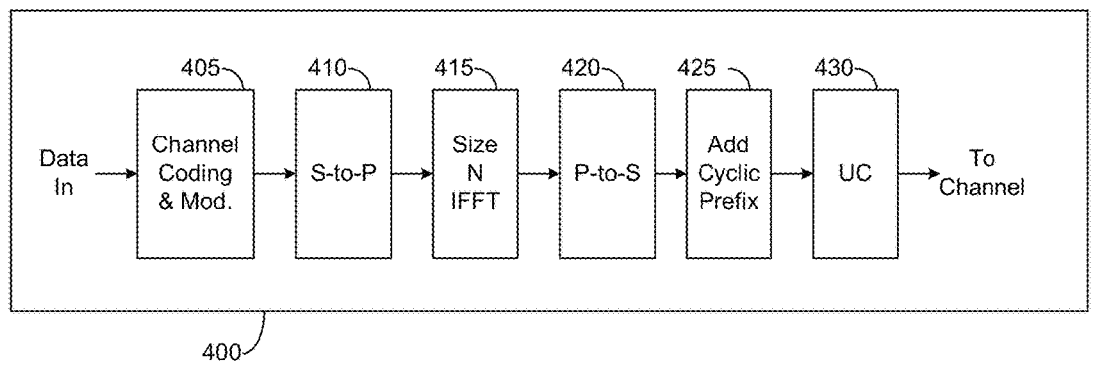
FIGS. 4A and 4B illustrate example wireless transmit and receive paths according to this disclosure.
Figure 4B:
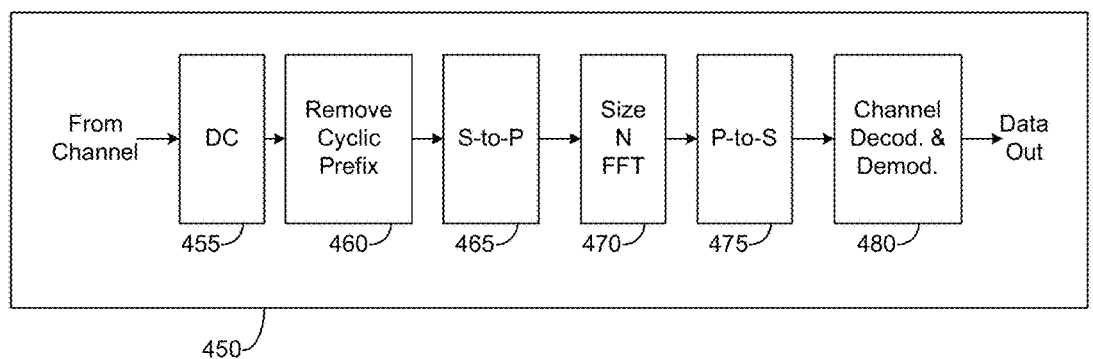

FIG. 4A is a high-level diagram of an orthogonal frequency division multiple access (OFDMA) transmit path. FIG. 4B is a high-level diagram of an orthogonal frequency division multiple access (OFDMA) receive path. In FIGS. 4A and 4B, the OFDMA transmit path is implemented in base station (BS) 116 and the OFDMA receive path is implemented in mobile station (MS) 108 for the purposes of illustration and explanation only. However, it will be understood by those skilled in the art that the OFDMA receive path also can be implemented in BS 116 and the OFDMA transmit path can be implemented in MS 108.

The transmit path circuitry 400 includes channel coding and modulation block 405, serial-to-parallel (S-to-P) block 410, Size N Inverse Fast Fourier Transform (IFFT) block 415, parallel-to-serial (P-to-S) block 420, add cyclic prefix block 425, up-converter (UC) 430. The receive path circuitry 450 comprises down-converter (DC) 455, remove cyclic prefix block 460, serial-to-parallel (S-to-P) block 465, Size N Fast Fourier Transform (FFT) block 470, parallel-to-serial (P-to-S) block 475, channel decoding and demodulation block 480.

At least some of the components in FIGS. 4A and 4B can be implemented in software while other components can be implemented by configurable hardware or a mixture of software and configurable hardware. In particular, it is noted that the FFT blocks and the IFFT blocks described in this disclosure document can be implemented as configurable software algorithms, where the value of Size N can be modified according to the implementation.

In BS 116, channel coding and modulation block 405 receives a set of information bits, applies LDPC coding and modulates (e.g., QPSK, QAM) the input bits to produce a sequence of frequency-domain modulation symbols. Serial-to-parallel block 410 converts (i.e., de-multiplexes) the serial modulated symbols to parallel data to produce N parallel symbol streams where N is the IFFT/FFT size used in BS 116 and MS 108. Size N IFFT block 415 then performs an IFFT operation on the N parallel symbol streams to produce time-domain output signals. Parallel-to-serial block 420 converts (i.e., multiplexes) the parallel time-domain output symbols from Size N IFFT block 415 to produce a serial time-domain signal. Add cyclic prefix block 425 then inserts a cyclic prefix to the time-domain signal. Finally, up-converter 430 modulates (i.e., up-converts) the output of add cyclic prefix block 425 to RF frequency for transmission via a wireless channel. The signal can also be filtered at baseband before conversion to RF frequency.

The transmitted RF signal arrives at MS 108 after passing through the wireless channel and reverse operations to those at BS 116 are performed. Down-converter 455 down-converts the received signal to baseband frequency and remove cyclic prefix block 460 removes the cyclic prefix to produce the serial time-domain baseband signal. Serial-to-parallel block 465 converts the time-domain baseband signal to parallel time domain signals. Size N FFT block 470 then performs an FFT algorithm to produce N parallel frequency-domain signals. Parallel-to-serial block 475 converts the parallel frequency-domain signals to a sequence of modulated data symbols. Channel decoding and demodulation block 480 demodulates and then decodes (i.e., performs LDPC decoding) the modulated symbols to recover the original input data stream.

Each of the base station 116 and access point 118 could implement a transmit path that is analogous to transmitting in the downlink to client devices 106-114 and implement a receive path that is analogous to receiving in the uplink from client devices 106-114. Similarly, each one of client devices 106-114 could implement a transmit path corresponding to the architecture for transmitting in the uplink to base station 116 and access point 118 and implement a receive path corresponding to the architecture for receiving in the downlink from base station 116 and access point 118.

The channel decoding and demodulation block 480 decodes the received data. The channel decoding and demodulation block 480 includes a decoder configured to perform a network assisted interference mitigation operation.

In certain wireless communications, extremely directional beamforming can be implemented by full-dimension multiple input multiple output (FD-MIMO) or fifth generation (5G) millimeter wave (mmWave) to improve the spectrum efficiency and to enable high order multiple user MIMO (MU-MIMO). Such precoding or beamforming is supported by non-codebook based precoding in 3GPP LTE-Advanced standards, and does not require signaling of the precoders as long as the same precoders are applied to the demodulation reference signal (DM-RS). Meanwhile, cell-specific reference signals (CRS) and user equipment (UEs) or channels (e.g., physical broadcast channel (PBCH), or control channels) relying on CRS cannot be transmitted via narrow beams, otherwise they cannot be received properly. Some resource elements (REs) are precoded or narrowly beam-formed and thus have extremely high power, while some other REs are transmitted via wide beam and thus have small power. As a result, UEs may potentially operate with a high dynamic range of power.

Figure 5A:
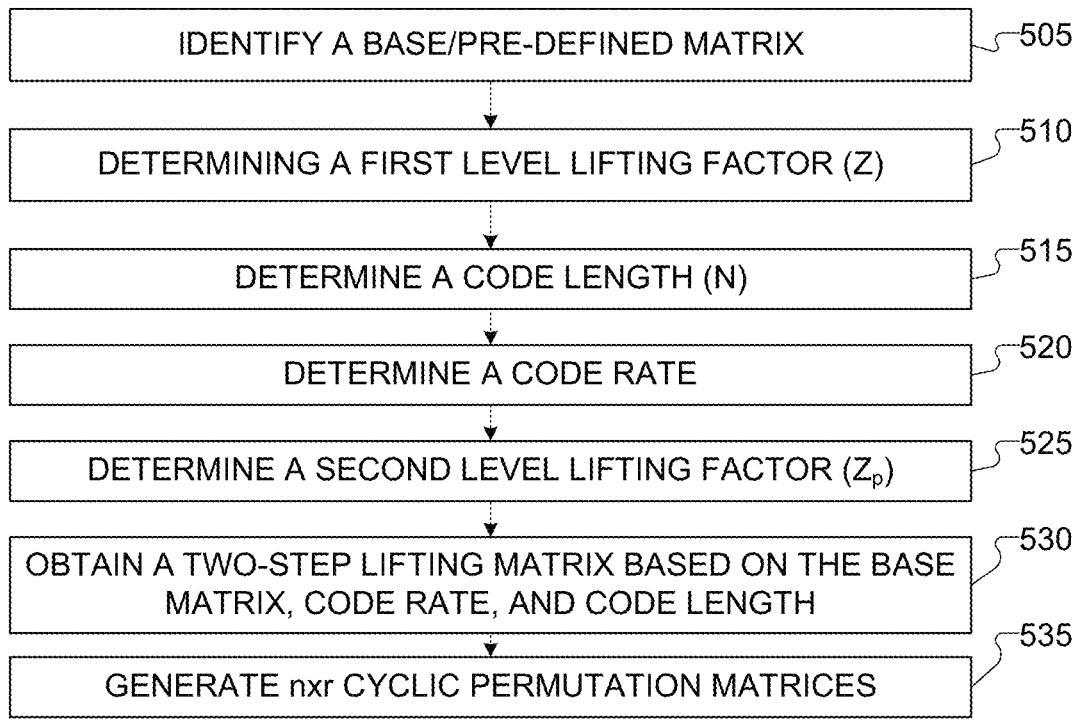
FIG. 5A illustrates a method of implementing a Channel Coding Framework for 802.11ay and Larger block-length LDPC codes for 11ay with two-step lifting matrices and in-place property according to this disclosure.

FIG. 5A illustrates a method 500 of implementing a Channel Coding Framework for 802.11ay and Larger block-length LDPC codes for 11ay with two-step lifting matrices and in-place property according to this disclosure. The method 500 can be implemented by an encoder or decoder, for example, one of the transmitting or receiving devices in within the system 100. For purposes of simplicity, the method 500 will be described as if implemented by the processing circuitry of the client device 300, in a case that the processing circuitry incorporates the encoder or decoder.

In block 505, the client device 300 identifies a pre-defined base matrix (namely a low density parity check (LDPC) code block H-matrix). The pre-defined base matrix includes n columns and r rows. As an example, the determined a pre-defined base matrix could be one of the four LDPC matrices defined by the IEEE 802.11ad standard, which are shown by reference numbers 605, 705, 805, and 905 of FIGS. 6, 7A, 8A, and 9A.

In block 510, the client device 300 determines a first level lifting factor (Z). For example, the client device 300 could make this determination of first level lifting factor based on the quantity of bits that a log-likelihood ratio (LLR) memory 1110 can receive and process. As another example, the client device 300 could make this determination of first level lifting factor based on the quantity of bits that the bit shifter 1020 can process.

In block 515, the client device 300 determines a code length (N) of a codeword received by or transmitted by the client device 300. In block 520, the client device 300 determines a code rate (R) of the codeword received by or to be transmitted by the client device 300. Herein, the codeword includes both the information bits to be transmitted and the parity bits.

In block 525, the client device 300 determines a second level lifting factor ($Z_p$). For example, the determination of the second level lifting factor can be made corresponding to the code length (N) of the codeword received by or to be transmitted by the client device 300. The second level lifting factor ($Z_p$) is a positive an integer that indicates how many times larger the determined code length is compared to a 672-bit codeword, which is supported by the 11ad standard. For example, code length of N=1344 corresponds to a second level lifting factor of $Z_p$=2. As another example, code length of N=2016 corresponds to a second level lifting factor of $Z_9$=3.

In block 530, the client device 300 obtains a two-step lifting matrix based on the base matrix. That is, the determination of which two-step lifting matrix to obtain is based on the code rate and code length. The two-step lifting matrix, itself, is based on the base matrix and has a same size (i.e., number of rows and columns) as the base matrix. Also, the two-step lifting matrix includes entries including ones (1's), zeros (0's), and negative ones (−1's). Once obtained, the client device stores the two-step lifting matrix in memory 360. Herein, the term "obtain" can mean generate or can mean receive. In certain embodiments, the client device 300 obtains a two-step lifting matrix by generating the two-step lifting matrix. In certain embodiments, the client device 300 obtains a two-step lifting matrix by receiving the two-step lifting matrix from an external transmitting device, such as the access point 118. As an example, a code length of N=1344 and code rate of R=13/16 correspond to the two-step lifting matrix 610 of FIG. 6. As another example, a code length of N=2016 and code rate of R=13/16 correspond to the two-step lifting matrix 615 of FIG. 6.

In block 535, the client device 300 generates a plurality of cyclic permutation matrices, namely, one cyclic permutation matrix per entry of the base matrix to lift the base matrix based on the lifting matrix to generate a larger matrix as discussed herein. Given that the base matrix includes n columns and r rows, the client device 300 generates n×r cyclic permutation matrices. Each cyclic permutation matrix is a square matrix that has 4 columns and $Z_p$ rows. As a specific example, in order to generate a cyclic permutation matrix corresponding to the entry at column 0 row 0 of the base matrix, the client device 300 applies the entry at column 0 row 0 of the two-step lifting matrix to the entry at column 0 row 0 of the base matrix. When the entry of the two-step lifting matrix is a zero (0) that is applied to the Z×Z cyclic-permutation matrix Pi in the code matrix (at the same location), a 2Z×2Z matrix is created as the cyclic permutation matrix according to the matrix below, wherein i represents the value of the entry of the base code matrix:

| $i$ | $-1$ |
|---|---|
| $-1$ | $i$ |

A zero (0) entry value with the two-step lifting matrix represents no cyclic shift of the i from the identity matrix in the cyclic permutation matrix. When the entry of the two-step lifting matrix is a one (1) that is applied to the Z×Z cyclic-permutation matrix Pi in the code matrix (at the same location), a 2Z×2Z matrix is created as the cyclic permutation according to the matrix below, wherein i represents the value of the entry of the base code matrix:

| $-1$ | $i$ |
|---|---|
| $i$ | $-1$ |

A one (1) entry value with the two-step lifting matrix represents one cyclic shift of the i rightward from the identity matrix in the cyclic permutation matrix. When the entry of the two-step lifting matrix is a negative one (−1) that is applied to the Z×Z zero matrix in the code matrix (at the same location), a 2Z×2Z zero matrix is created as the cyclic permutation. A negative one (−1) entry value with the two-step lifting matrix represents a zero matrix in the cyclic permutation matrix.

Although FIG. 5A illustrates one example of a method 500 of implementing a Channel Coding Framework for 802.11ay and Larger block-length LDPC codes for 11ay with two-step lifting matrices and in-place property, various changes may be made to FIG. 5A.

Figure 5B:
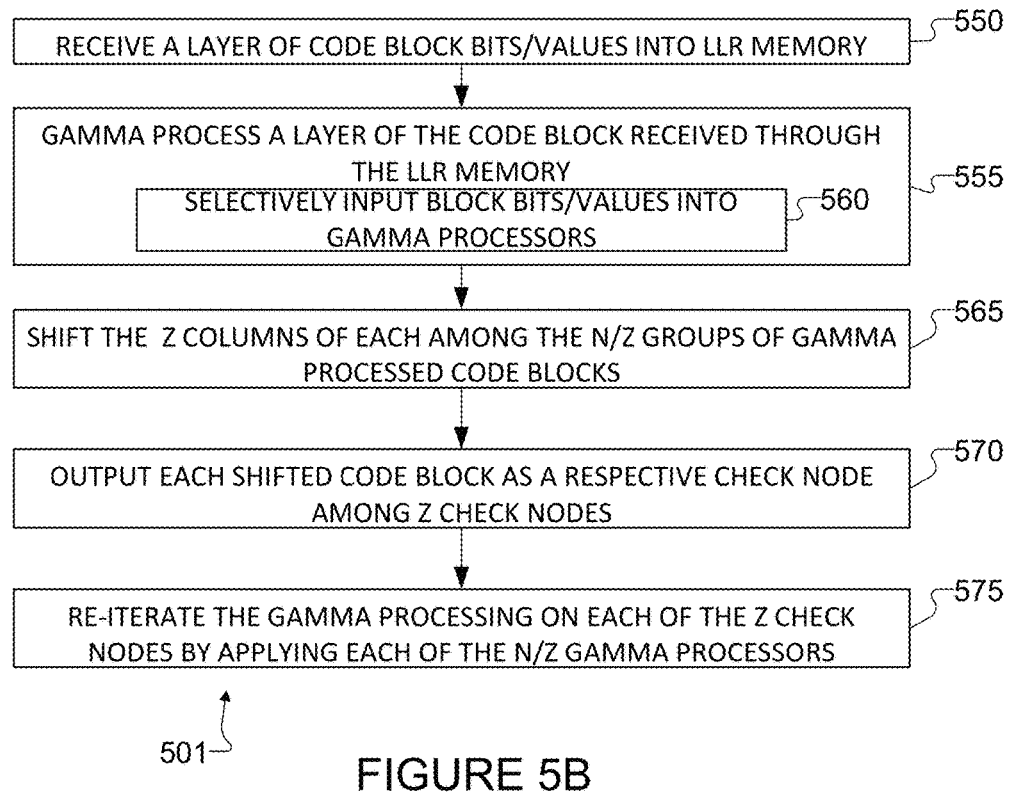
FIG. 5B illustrates a method of decoding a codeword according to this disclosure.

FIG. 5B illustrates a method 501 of decoding a codeword according to this disclosure. The method 501 can be implemented by a decoder 1100, 1200, 1300, 1400, 1500, and 1600 that includes any of the decoding hardware architectures shown in FIGS. 11-16. For purposes of simplicity, the method 501 will be described as if implemented by the processing circuitry of the client device 300, in a case that the processing circuitry incorporates the decoder 1100.

In block 550, the decoder 1100 receives an encoded codeword as layer of code block bit values into a plurality of LLR memory units.

In block 555, the decoder 1100 gamma processes the layer of the received code block. For example, the decoder 1100 could selectively input a subset of the codeword into the gamma processors of the decoder 1100 (in block 560). The subset of the codeword could include Z bits from each of the d LLR memory units 1110.

As discussed herein, "d" is the degree of the 11ad machine 1005 in the decoder 1100. In the example shown by FIG. 111, the degree is sixteen (d=16) and each of the Z check nodes 1025-1030 receives d bits, namely, one bit from each of the sixteen (d=16) 42-bit shifters 1020. In the 11ad machine 1005, the check node 0 1020 through check node 41 1015, collectively, receive a layer of 672 bits of code according to the degree 16 base matrix defined by the IEEE 802.11ad standard. Note that each degree corresponds to a column of the base matrix, and that each entry of the base matrix represents a Z×Z matrix.

In block 565, the decoder 1100 shifts Z columns of each among the N/Z (d=N/Z) groups of gamma processed code blocks. In block 570, the decoder 1100 outputs each shifted code block to a respective check node among the Z check nodes. In block 575, the decoder re-iterates the gamma processing on each of the Z check nodes by applying each of the N/Z gamma processors.

Figure 5C:
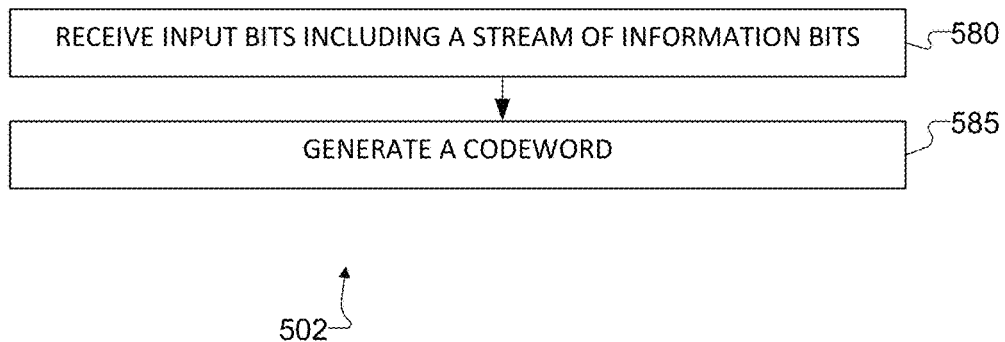
FIG. 5C illustrates an encoding method according to this disclosure.

FIG. 5C illustrates an encoding method 502 according to this disclosure. The method 502 includes receiving input bits including a stream of information bits (block 580), and generating a codeword including parity bits and the received input bits (block 585). For example, in block 585, the method 502 includes encoding the codeword based on the base and lifting matrix discussed above with regard to FIG. 5A to generate the codeword having the desired length.

Figure 6:
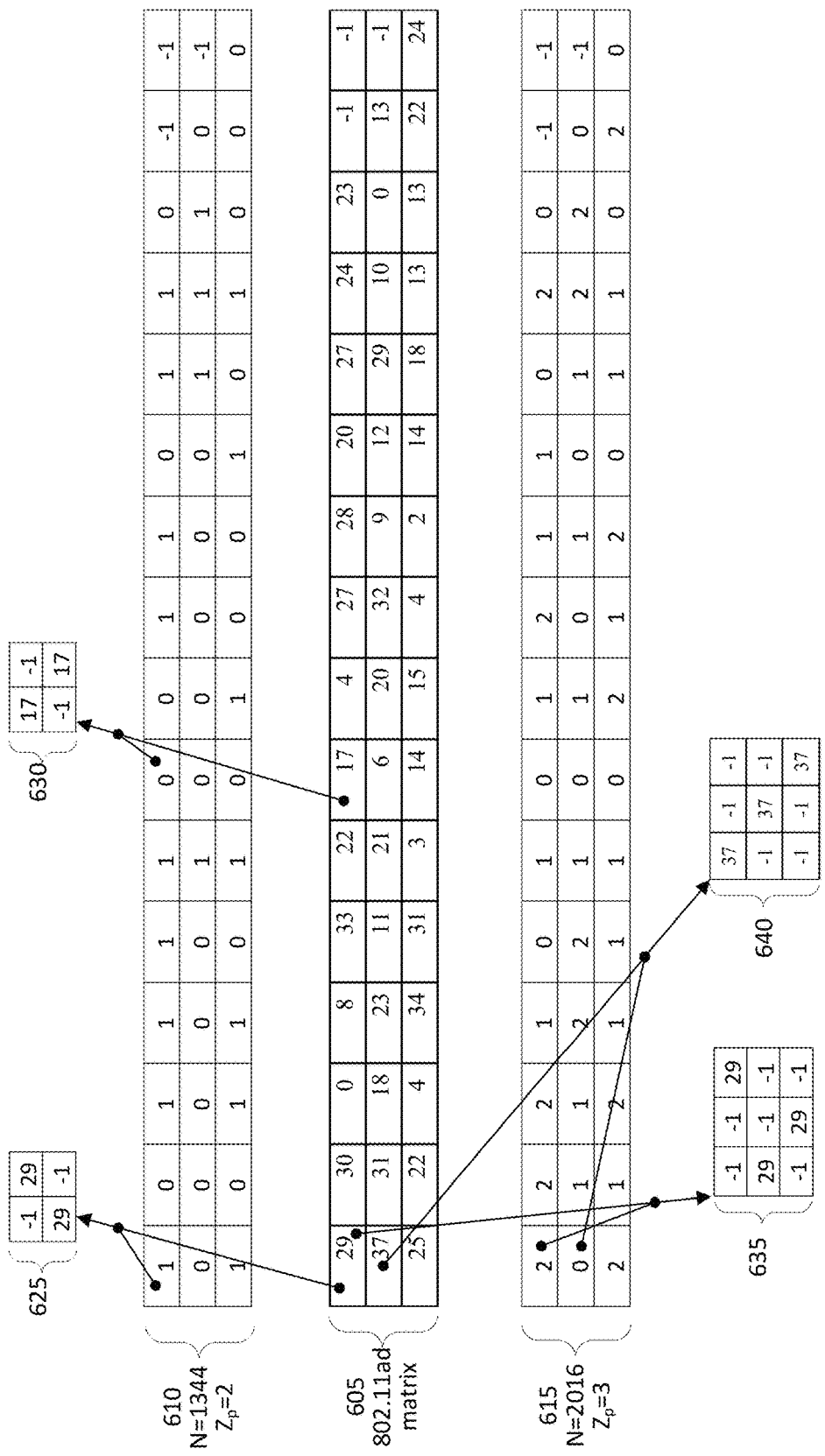
FIG. 6 illustrates an LDPC code base matrix, a length-1344 two-step lifting matrix, and a length-2016 two-step lifting matrix according to the code rate 13/16 according to this disclosure.

FIG. 6 illustrates a length-672 LDPC code base matrix 605, a length-1344 two-step lifting matrix 610, and a length-2016 two-step lifting matrix 615 according to the code rate 13/16 according to this disclosure. The LDPC code base matrix 605 is one of the four LDPC code H-matrices defined by the IEEE 802.11ad standard. The two-step lifting matrices 610 and 615 are in-place, and defined as shown in FIG. 6.

In embodiments according to a code length N=1344, as an example, a cyclic permutation matrix 625 can be generated by applying the entry value "1" at the (row 0, column 0) entry of the length-1344 two-step lifting matrix 610 to the entry value "29" at the same location (namely, (0,0)) of the base matrix 605. As another example, a cyclic permutation matrix 630 can be generated by applying the entry value "0" at the (6, 0) entry of the length-1344 two-step lifting matrix 610 to the entry value "17" at the same location (namely, (6,0)) of the base matrix 605. Note that the cyclic permutation matrices 625 and 630 have a size $Z_p \times Z_p = 2 \times 2$.

In embodiments according to a code length N=2016, as an example, a cyclic permutation matrix 635 can be generated by applying the entry value "2" at the (row 0, column 0) entry of the length-2016 two-step lifting matrix 615 to the entry value "29" at the same location (namely, (0, 0)) of the base matrix 605. Note that the two (2) entry value with the two-step lifting matrix represents a corresponding number (i.e., two) of cyclic shifts of the i rightward from the identity matrix in the cyclic permutation matrix. As another example, a cyclic permutation matrix 640 can be generated by applying the entry value "0" at the (0, 1) entry of the length-2016 two-step lifting matrix 615 to the entry value "37" at the same location (namely, (0,1)) of the base matrix 605. Note that the cyclic permutation matrices 635 and 640 have a size $Z_p \times Z_p = 3 \times 3$.

Although FIG. 6 illustrates one example of an LDPC code base matrix 605, a length-1344 two-step lifting matrix 610, and a length-2016 two-step lifting matrix according to the code rate 13/16, various changes may be made to FIG. 6. For example, additional two-step lifting matrices can be designed according to larger second level lifting factors ($Z_p$), such as Zp=4, in which case the two-step lifting matrix would include entry values of 0's, 1's, 2's, 3's, and −1's.

FIG. 7A illustrates a length-672 LDPC code base matrix 705 according to the code rate 3/4 according to this disclosure. FIG. 7B illustrates a length-1344 two-step lifting matrix 710 according to the code rate 3/4 according to this disclosure. FIG. 7C illustrates a length-2016 two-step lifting matrix 715 according to the code rate 3/4 according to this disclosure.

Figures 8A, 8B, 8C:
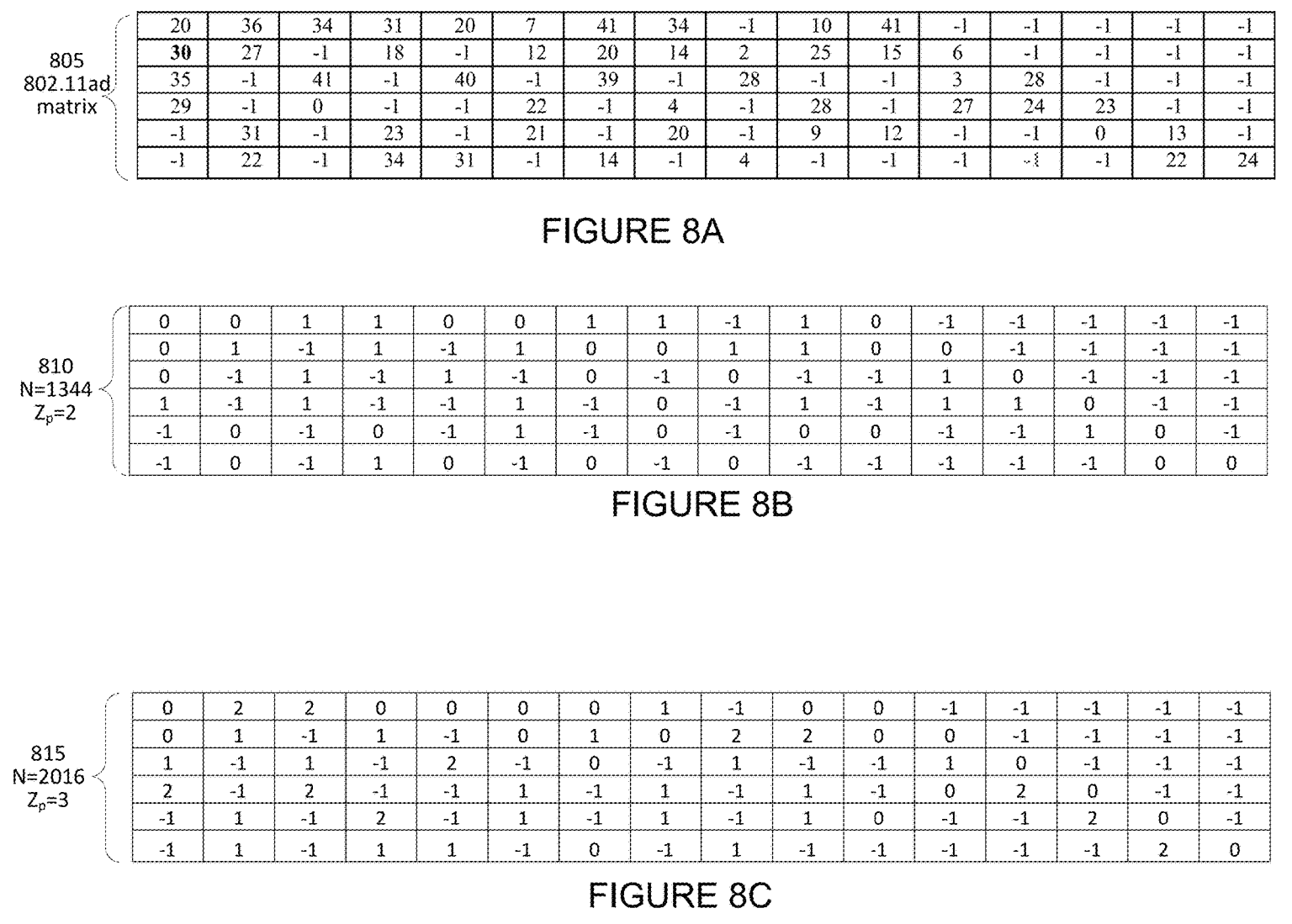

FIG. 8A illustrates a length-672 LDPC code base matrix 805 according to the code rate 5/8 according to this disclosure. FIG. 8B illustrates a length-1344 two-step lifting matrix 810 according to the code rate 5/8 according to this disclosure. FIG. 8C illustrates a length-2016 two-step lifting matrix 815 according to the code rate 5/8 according to this disclosure.

FIG. 9A illustrates a length-672 LDPC code base matrix 905 according to the code rate 1/2 according to this disclosure. FIG. 9B illustrates a length-1344 two-step lifting matrix 910 according to the code rate 1/2 according to this disclosure. FIG. 9C illustrates a length-2016 two-step lifting matrix 915 according to the code rate 1/2 according to this disclosure.

Although the matrices of FIGS. 6, 7A-7C, 8A-8C, and 9A-9C are shown in groups according to code rate, various changes can be made to the grouping of matrices. For example, according to this disclosure, a family of length-1344 LDPC codes can be obtained by and stored in the client device 300 or server 200. The family of length-1344 LDPC codes includes the two-step lifting matrices 610, 710, 810, and 910 of FIGS. 6-9. Note that each family of LDPC codes includes matrices having a same code length and a plurality of code rates. As another example, according to this disclosure, a family of length-2016 LDPC codes can be obtained by and stored in the client device 300 or server 200. The family of length-2016 LDPC codes includes the two-step lifting matrices 615, 715, 815, and 915 of FIGS. 6-9.

Figures 10, 11:
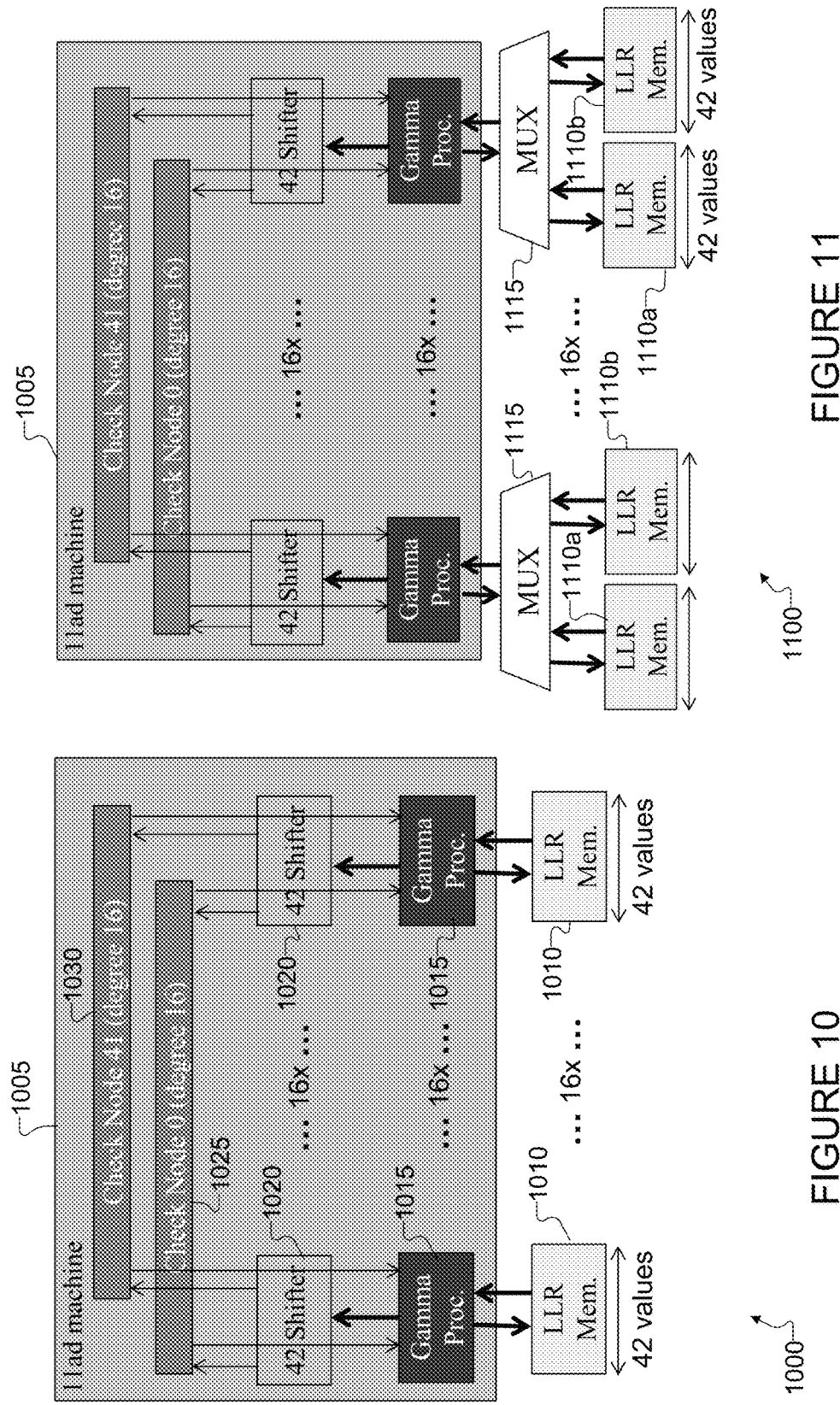
FIG. 10 illustrates an LDPC decoder 1000 for decoding a codeword that meets the 11ad standard according to this disclosure.
FIG. 11 illustrates a two-step 1344-length LDPC layer decoder according to embodiments of this disclosure.

FIG. 10 illustrates an LDPC decoder 1000 for decoding a codeword that meets the 11ad standard according to this disclosure. The decoder 1000 includes an 11ad machine 1005 characterized by the degree "d" and d LLR memory units 1010. In the example shown, the degree is sixteen (d=16). Herein, the LDPC decoder 1000 is referred to as an "11ad LDPC decoder."

Each LLR memory unit 1010 receives 42 values, generates 42 LLR values based on the received values, and outputs the generated LLR values. The d LLR memory units 110, collectively, receive a layer of code block bit values to be decoded. In the example shown, each LLR memory unit 1010 outputs the generated LLR values to the 11ad machine 1005.

The 11ad machine 1005 includes d gamma processors 1015, d 42-bit shifters 1020, and Z=42 check nodes 1025-1030 (i.e., check nodes 0 through 41. Each gamma processor 1015 receives 42 LLR values output from a corresponding LLR memory unit 1010. In the 11ad machine 1005, the d gamma processors 1015, collectively, receive and gamma process a layer of 672 LLR values according to an LDPC encoding process. Note that the first level lifting factor (Z) could be the same as: the quantity of values that each LLR memory unit stores; the quantity of values that each gamma processor 1015 processes; the quantity of values that shifter can shift, or the quantity of check nodes 1025-1030.

Each 42-bit shifter 1020 receives 42 gamma-processed bits from a corresponding gamma processor 1015. In the 11ad machine 1005, the d 42-bit shifters 1020, collectively, shift a layer of 672 gamma-processed bits according to the LDPC encoding process.

Each of the Z check nodes 1025-1030 receives d bits, namely, one bit from each of the sixteen (d=16) 42-bit shifters 1020. In the 11ad machine 1005, the check node 0 1020 through check node 41 1015, collectively, receive a layer of 672 bits of code according to the degree 16 base matrix defined by the IEEE 802.11ad standard. Note that each degree corresponds to a column of the base matrix, and that each entry of the base matrix represents a Z×Z matrix.

Although FIG. 10 illustrates one example of an 11ad decoder 1000, various changes may be made to FIG. 10. For example, as a non-scalable variation example, each of the components 1010, 1015, and 1020 of the 11ad decoder 1005 could be enlarged to an 84-value LLR memory 1410, 84-value gamma processor 1415, and variable shifter 1420 that shifts either 42 or 84 bits as shown in the 1344-length decoder 1400 of FIG. 14. The decoder 1400 of FIG. 14 includes 84 check nodes 1025-1430 (Check Node 0 through Check Node 83), corresponding to a first level lifting factor Z=84. Also, the decoder 1400 has two times (2×) the throughput compared to the decoder 1000. As another non-scalable variation example, the each of the components 1410, 1415, and 1420 of the decoder 1400 of FIG. 14 could be enlarged to a 126-value LLR memory 1510, 126-value gamma processor 1515, and variable shifter 1520 that shifts either 42, 84, or 126 bits as shown in the 2016-length decoder 1500 of FIG. 15. The decoder 1500 of FIG. 15 includes 126 check nodes 1025-1530 (Check Node 0 through Check Node 125), corresponding to a first level lifting factor Z=126. Also, the decoder 1500 has two times (3×) the throughput compared to the decoder 1000.

FIG. 11 illustrates a two-step 1344-length LDPC layer decoder 1100 according to embodiments of this disclosure. The decoder 1100 decodes a codeword that has a code length of N=1344, which is a code length that is two times (2×) longer than the codeword of the 11ad LDPC decoder 1000 of FIG. 10. That is, the decoder 1100 is configured to decode a codeword having a code length that is that an integer ($Z_p$) multiple of 672 bits. In the example shown, $Z_p$=2. The decoder 1100 implements a Channel Coding Framework for 802.11ay and Larger block-length LDPC codes for 11ay with two-step lifting matrices and in-place property.

The decoder 1100 includes an 11ad machine 1005, thirty-two ($d \times Z_p = 16 \times 2 = 32$) LLR memory units 1110 (specifically referred to as 1110a-1110b), and sixteen (d=16) multiplexers 1115. The LLR memory units 1110 could be the same as or similar to the LLR memory units 1010 of FIG. 10.

Each multiplexer 1115 is coupled to and receives LLR values from a number $Z_p$ of LLR memory units 1110a-1110b. More particularly, each multiplexer 1115 selectively outputs Z=42 LLR values from among the eighty-four ($Z \times Zp = 42 \times 2 = 84$) LLR values received from the two LLR memory units 1110a-1110b. Each multiplexer 1115 selectively outputs values to the 11ad machine 1005 according to a pipeline sequence.

The 11ad machine 1005 in FIG. 11 is coupled to and receives the selectively outputted Z=42 LLR values from each of the sixteen multiplexers 1115. According to the pipeline sequence, the 11ad machine 1005 applies an LDPC decoding process to a first code block segment (672-bits) of the 1344-length codeword, and next applies the LDPC decoding process to a second code block segment (672-bits) of the 1344-length codeword. That is, after decoding the first code block segment, the 11ad machine 1005 outputs the decoded values through the sixteen (d=16) gamma processors 1015. At this time, each multiplexer 1115 perform a demultiplexing operation, namely, selectively outputting 42 values to one of the two corresponding LLR memory units 1110a-1110b.

Note that the hardware architecture of the decoder 1100 includes additional hardware components, namely, the multiplexers 1115 (including the memory), than the 11ad decoder 1000 of FIG. 10. More particularly, the additional hardware increases the area by only 4%.

Figure 12:
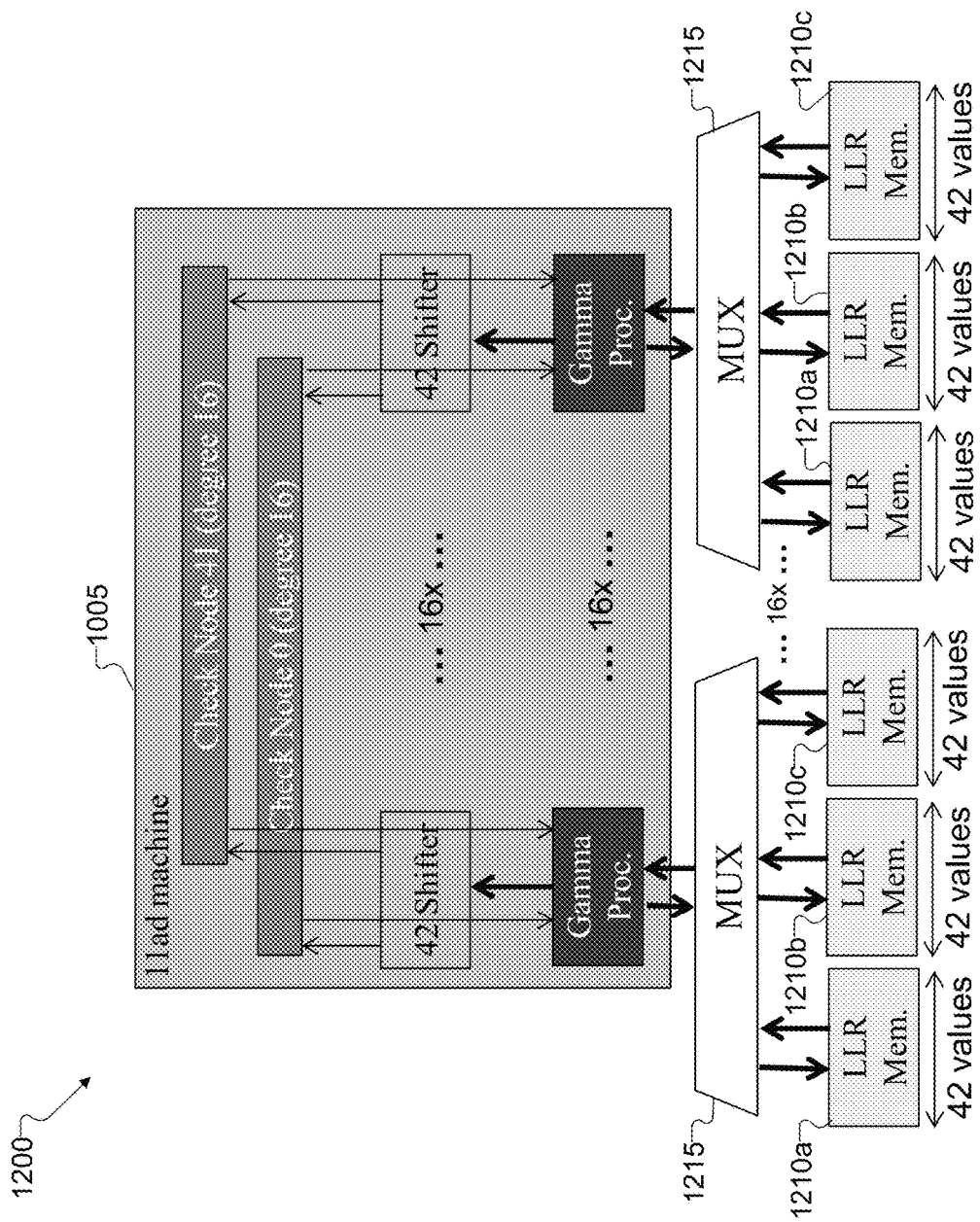
FIG. 12 illustrates a two-step 2016-length LDPC layer decoder including a larger sized multiplexers that selectively output 42-values from among the number three corresponding LLR memory units according to this disclosure.

Although FIG. 11 illustrates one example of a two-step 1344-length LDPC layer decoder 1100, various changes may be made to FIG. 11. For example, the hardware architecture is can be scaled to process longer code block lengths. As a particular example of scaling, FIG. 12 illustrates a two-step 2016-length LDPC layer decoder 1200, which includes a larger sized multiplexers 1215 configured to selectively output 42-values from among the number $Z_p$=3 of corresponding LLR memory units 1210a-1210c. Each of the LLR memory units 1210a-1210c could be the same as or similar to the LLR memory units 1010 of FIG. 10. Also, the decoder 1200 can operate in a similar manner as the decoder 1100 of FIG. 11 by decoding a 1344-length codeword using a subset of the LLR memory units 1210a-1210c. The decoders 1000, 1100, and 12 of FIGS. 10-12 have equal throughputs for decoding.

Figure 13:
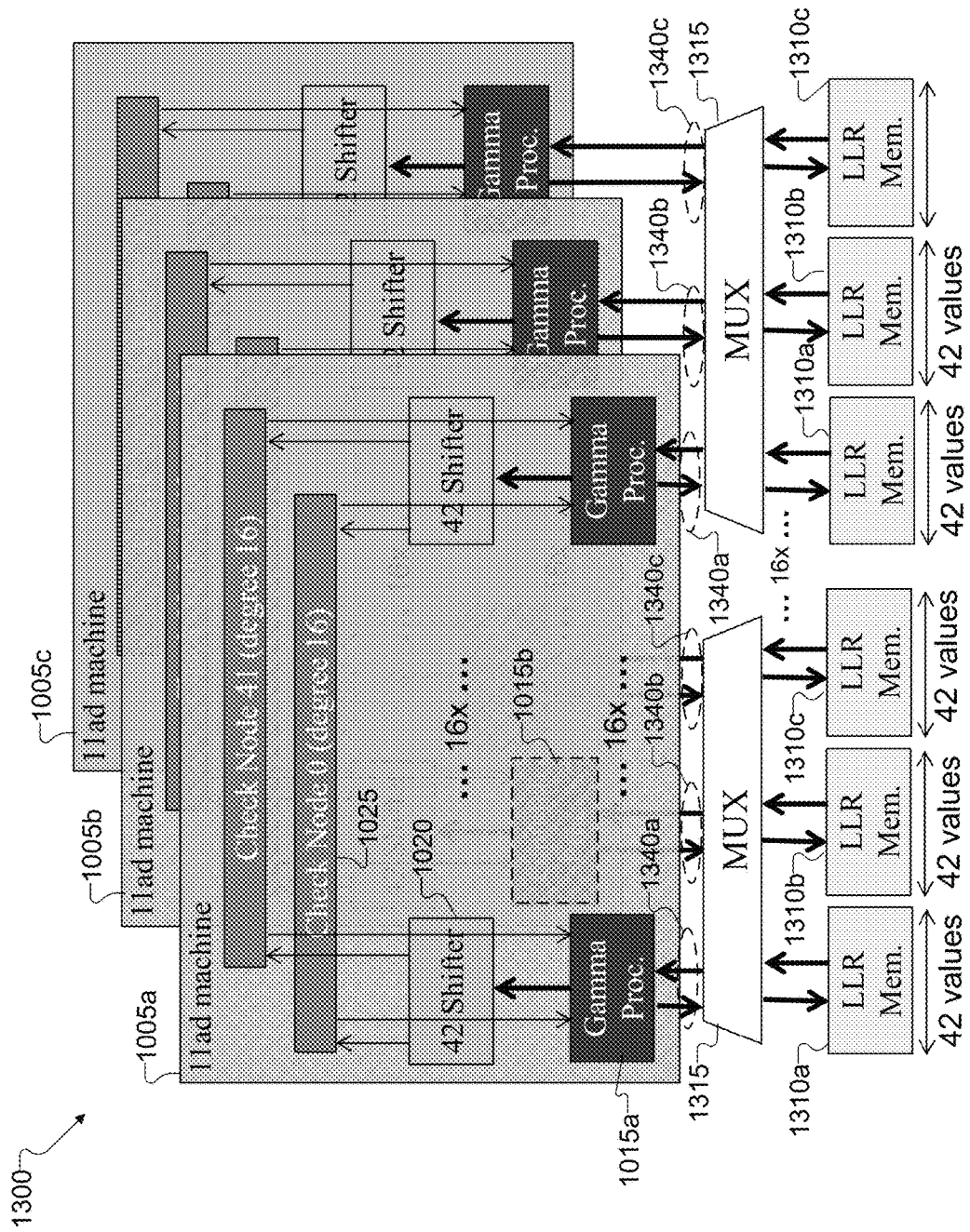
FIG. 13 illustrates a two-step 2016-length LDPC layer decoder according to embodiments of this disclosure.
Figures 14, 15:
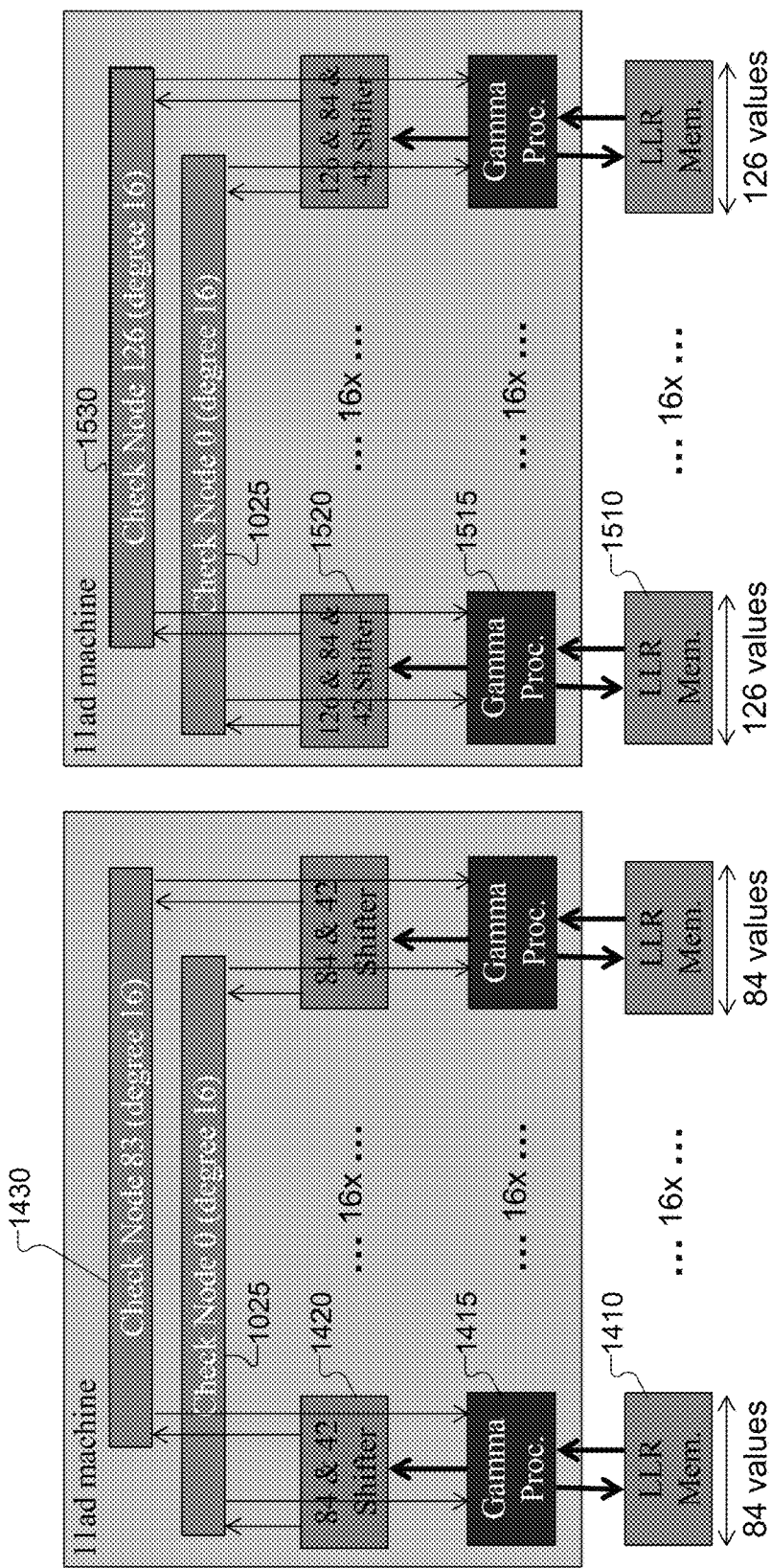
FIG. 14 illustrates a two-step 1344-length LDPC layer decoder according to embodiments of this disclosure.
FIG. 15 illustrates a two-step 2016-length LDPC layer decoder according to embodiments of this disclosure.

FIG. 13 illustrates a two-step 2016-length LDPC layer decoder 1300 according to embodiments of this disclosure. The decoder 1300 decodes a codeword that has a code length of N=2016, which is a code length that is three times (3×) longer than the codeword of the 11ad LDPC decoder 1000 of FIG. 10. That is, the decoder 1300 is configured to decode a codeword having a code length that is that an integer ($Z_p$) multiple of 672 bits. In the example shown, $Z_p$=3. The decoder 1300 implements a Channel Coding Framework for 802.11ay and Larger block-length LDPC codes for 11ay with two-step lifting matrices and in-place property.

The decoder 1300 includes an integer number ($Z_p$=3) of 11ad machines 1005a-1005c that are configured to decode in parallel with each other, forty-eight (d×$Z_p$=16×3=48) LLR memory units 1310 (specifically referred to as 1310a-1310c), and sixteen (d=16) multiplexers 1315. The 11ad machines 1005a-1005c and LLR memory units 1310 could be the same as or similar to the corresponding 11ad machine 1005 and LLR memory units 1010 of FIG. 10. Note that the integer number ($Z_p$=3) of 11ad machines 1005a-1005c decoding in parallel with each other enables the decoder 1300 to have a corresponding increase in throughput, namely, a three times (3×) increase of throughput compared to decoders 1000, 1100, and 12 of FIGS. 10-12. The three times (3×) increase of throughput corresponds to the second level lifting factor Zp=3.

In the decoder 1300, each multiplexer 1315 is coupled to and receives from a number $Z_p$ of LLR memory units 1310a-1310c. More particularly, each multiplexer 1115 selectively outputs an integer multiple of 672 LLR values (namely, Zp×672=3×672=2016) from among the 2016 values received from the three LLR memory units 1310a-1310c. Each multiplexer 1315 selectively outputs values from one of the three LLR memory units 1310a-1310c to a corresponding one of the three 11ad machines 1005a-1005c in parallel. That is, each 11ad machine 1005a-1005c is coupled to the sixteen (d=16) multiplexers 1315. In a particular example operation of the multiplexers 1315, in a first 11ad machine 1005a, the gamma processor 1015a may receive 42 LLR values from the LLR memory unit 1310a through a first interface 1340a; in a second 11ad machine 1005b, the gamma processor 1015b (translucent in view) may receive another 42 LLR values from the LLR memory unit 1310b through a second interface 1340b; and in a third 11ad machine 1005c, the gamma processor 1015c (hidden from view) may receive another 42 LLR values from the LLR memory unit 1310c through a first interface 1340c of the multiplexer 1315.

Figure 16:
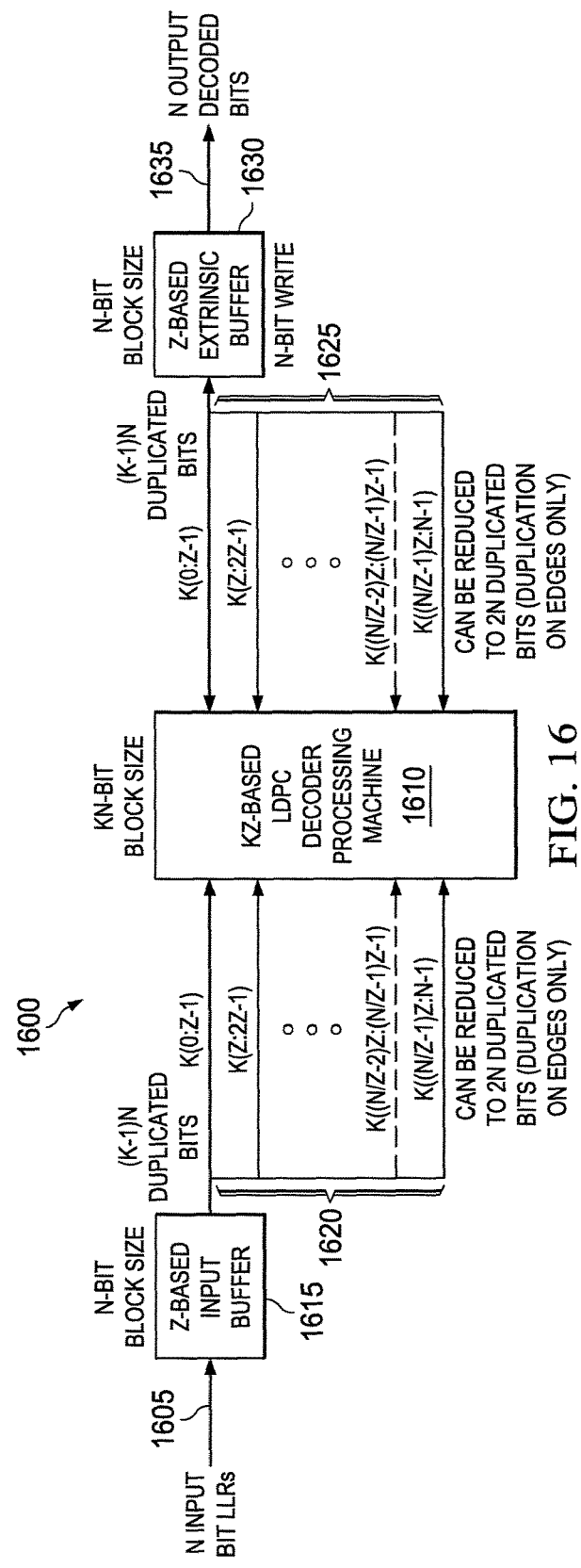
FIG. 16 illustrates an LDPC decoder that decodes an N-bit sized code block using a KN-bit decoder machine according to this disclosure.

FIG. 16 illustrates an LDPC decoder 1600 that decodes an N-bit sized code block 1605 using a KN-bit decoder machine 1610 according to this disclosure. The N-bit sized code block 1605 to be decoded corresponds to a first level lifting factor Z, which could be 42, 84, 126, and so forth. The KN-bit decoder machine 1610 processes according to a KZ lifting factor, wherein KZ is an integer multiple of the first level lifting factor Z.

The LDPC decoder 1600 includes a Z-based input buffer 1615 configured to receive a codeword that has an N-bit block size, and to output a plurality of (K−1)N duplicated bits. The KN-bit decoder machine 1610 receives the plurality of (K−1)N duplicated bits 1620, which can be described as the set $$\left\{ K(0:Z-1), K(Z:2Z-1), \right.$$
$$\left. \ldots K\left(\left(\frac{N}{Z}-2\right)Z: \left(\frac{N}{Z}-1\right)(Z-1)\right), K\left(\left(\frac{N}{Z}-1\right)Z: (N-1)\right) \right\}.$$

The input duplication is on edges only, and can be reduced to 2N duplicated bits.

The LDPC decoder 1600 includes the KN-bit decoder machine 1610, which generates and outputs a plurality of (K−1)N duplicated bits 1625, which can be described as the set $$\left\{ K(0:Z-1), K(Z:2Z-1), \right.$$
$$\left. \ldots K\left(\left(\frac{N}{Z}-2\right)Z: \left(\frac{N}{Z}-1\right)(Z-1)\right), K\left(\left(\frac{N}{Z}-1\right)Z: (N-1)\right) \right\}.$$

The output duplication is on edges only, and can be reduced to 2N duplicated bits.

The LDPC decoder 1600 includes a Z-based extrinsic buffer 1630 that is configured to receive the plurality of (K−1)N duplicated bits 1625 according to a pipeline sequence and to output N decoded bits 1635 as one group of duplicated bits from among the plurality of (K−1)N duplicated bits 1625.

Figure 17:
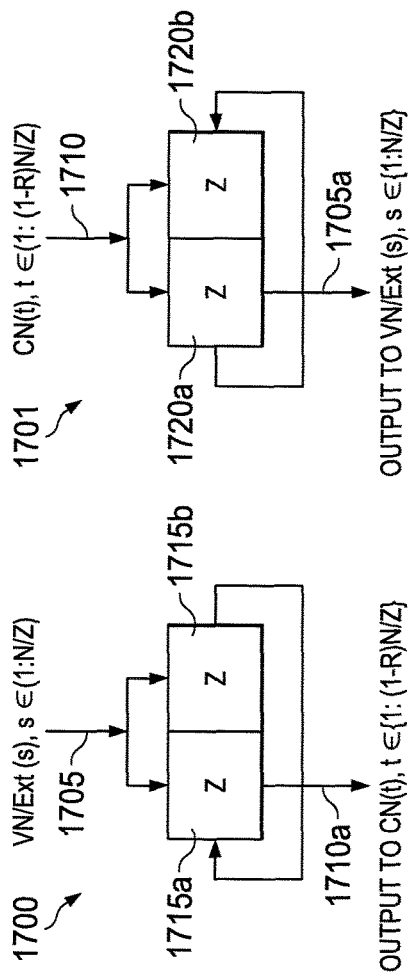
FIGS. 17 and 18 illustrate example implementations of multiple size shifter in extended lifting codes within the decoder of FIG. 16.
Figure 18:
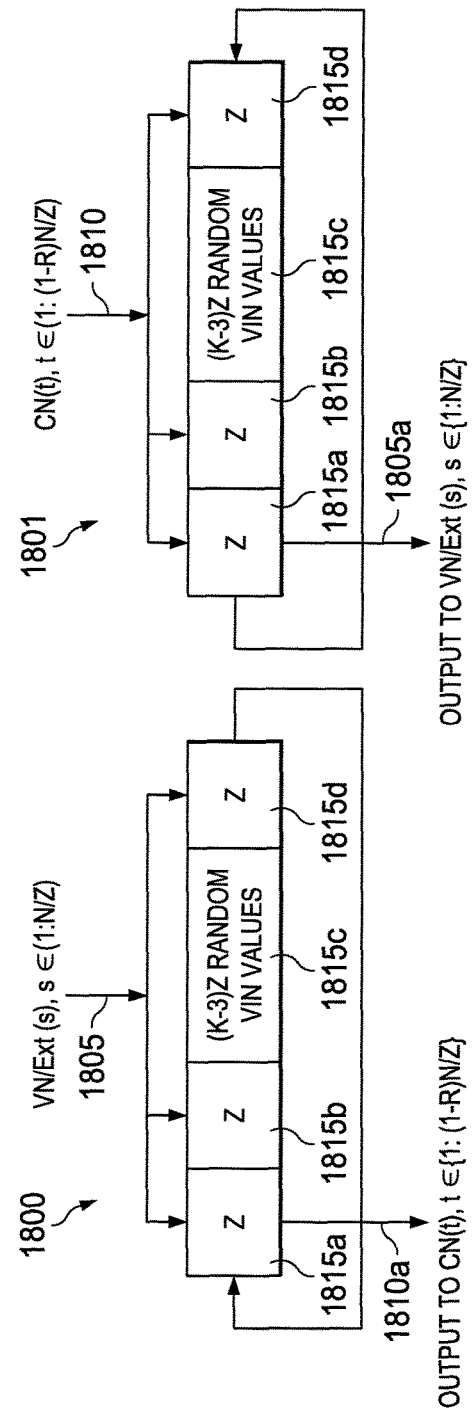

FIGS. 17 and 18 illustrate example implementations of multiple size shifter in extended lifting codes within the decoder 1600 of FIG. 16. FIG. 17 illustrates a variable node 1700 and a check node 1701 that receive an input 1705, 1710 respectively and generate K=2 duplications 1715a-1715b and 1720b-1720b of a received input respectively. The variable node 1700 outputs one of the duplications 1715a of Z-bits to the check node 1701. That is, the output 1710a of the variable node 1700 is the same as the input of the check node 1701. Similarly, the check node 1701 outputs one of the duplications 1720a of Z-bits to the variable node 1700 such that the output 1705a of the check node 1701 is the same as the input of the variable node 1700.

FIG. 18 illustrates a variable node 1800 and a check node 1801 that receive an input 1805, 1810 respectively and generate a plurality of more than two (K>2) duplications 1815a-1815b and 1820a-1820d of a received input respectively. The variable node 1800 and check node 1801 of FIG. 18 operate in a similar manner as the variable node 1700 and check node 1701 of FIG. 17.

A single N-bit block 1605 can be decoded in the KN-bit decoding machine 1610 without any changes to the KN-bit decoder 1600. However, the efficiency of the decoder is significantly reduced since $$\left(\frac{K-1}{K}\right)$$

of the decoder 1600 is unexploited (50% in the case of K=2). A multi LN-bit code (with LZ lifting factor, L≤K) can be decoded using the KN-bit machine (with KZ lifting factor). However, an additional switching in KZ-shifter of the KZ-bit decoder machine is required to support the multiple block sizes.

Figure 19:
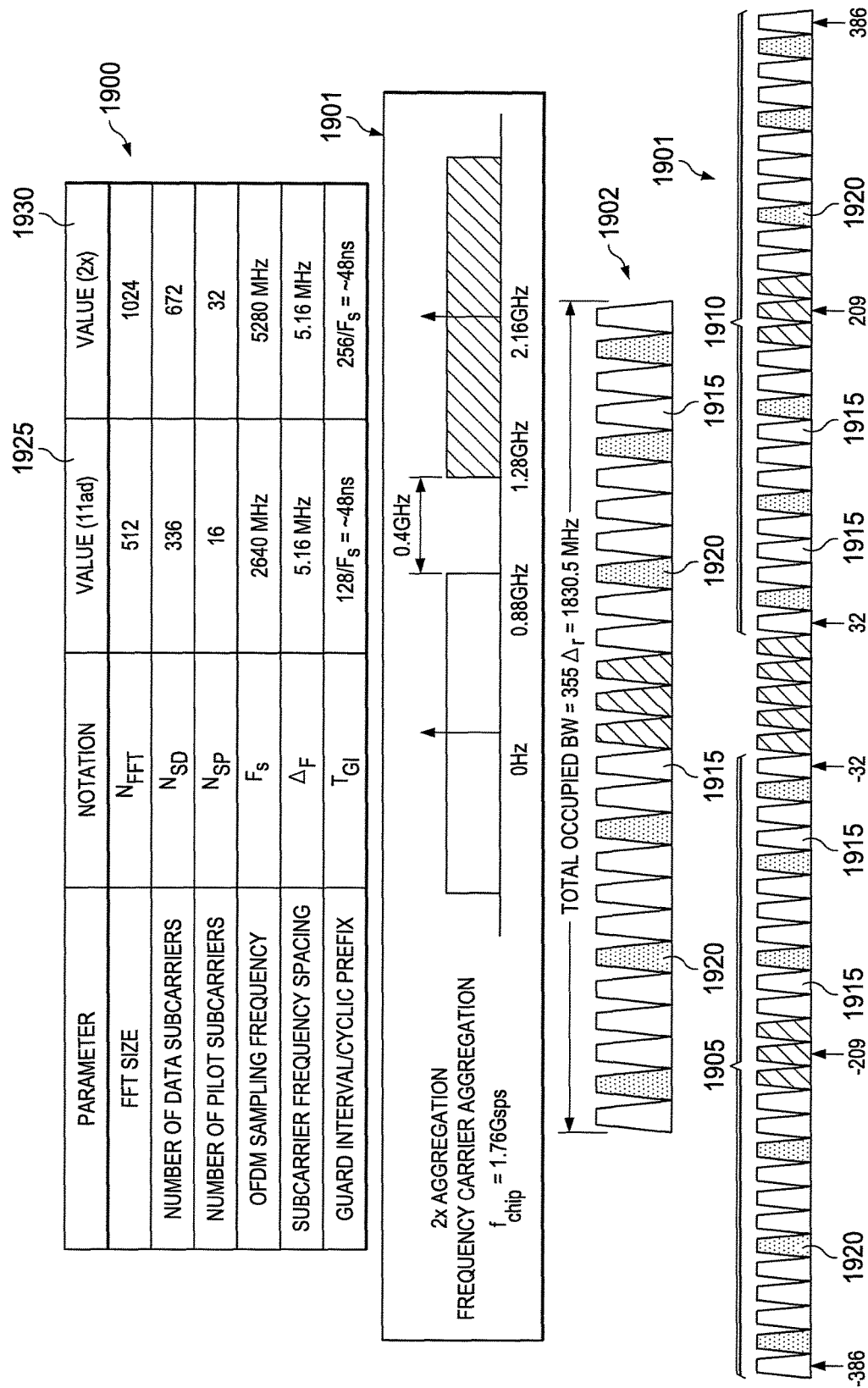
FIG. 19 illustrates a table of OFDM parameters and a payload spectrum for a 2× channel bonding according to this disclosure.

FIG. 19 illustrates a table 1900 of OFDM parameters and a payload spectrum 1901 for a 2× channel bonding according to this disclosure. The 2× channel bonding scheme shown in FIG. 19 can implemented by the client device 300, access point 118, or server 200. As shown, the payload spectrum 1901 is formed by bonding two sub-channels 1905 and 1910. Each of the sub-channels 1905 and 1910 could have a similar structure as a full bandwidth channel 1902 according to the IEEE 802.11ad standard. As shown, the payload spectrum 1901 can be divided into a plurality of subcarriers, including 672 data subcarriers 1915 and 32 pilot subcarriers 1920.

According to column 1925 of the table 1900, the full bandwidth channel 1902 includes 16 pilot subcarriers 1920, namely the set of [±10, ±30, ±50, ±70, ±90, ±110, ±130, ±150]. The full bandwidth channel 1902 includes three DC sub carriers, namely the set of [−1, 0, 1]. The remainder of the full bandwidth channel 1902 includes 336 data subcarriers 1915.

According to column 1930 of the table 1900, the full bandwidth of the payload spectrum 1901 for a 2× channel bonding includes two times (2×) the quantity of data and pilot subcarriers as the 11ad channel 1902. Also, the full bandwidth of the payload spectrum 1901 includes 5 DC subcarriers.

Although FIG. 19 illustrates an example 2× channel bonding scheme, various changes may be made to FIG. 19. For example, the channel bonding scheme can be scaled to a 3× channel bonding or a greater number of sub-channels bonded together.

Figure 20:
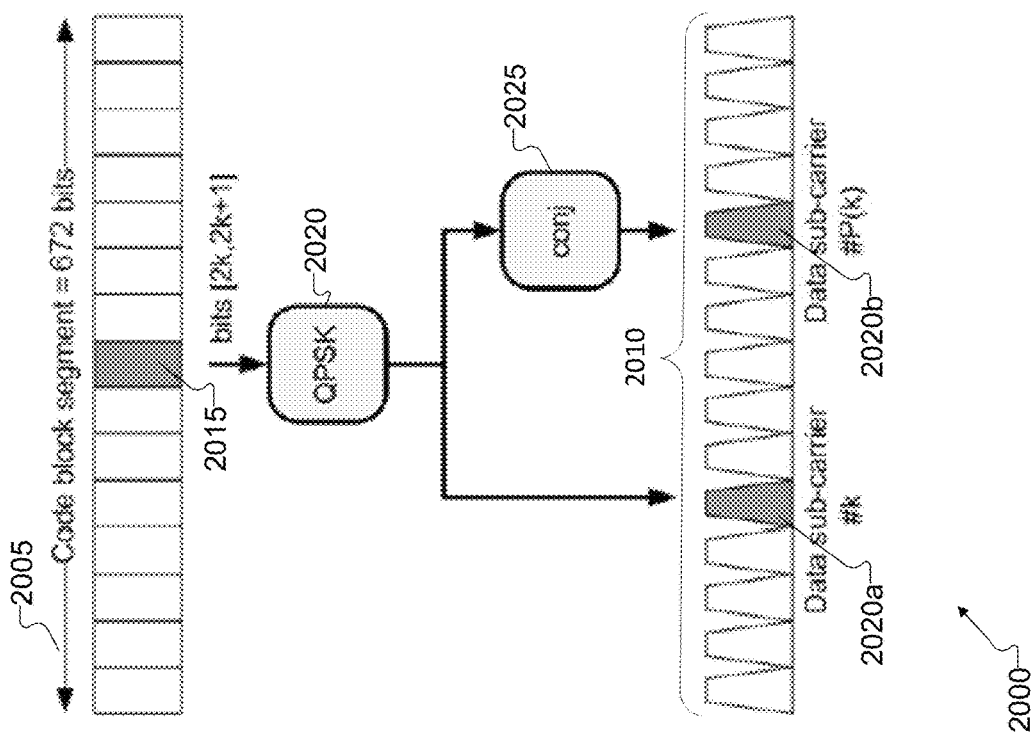

FIG. 20 illustrates an example of OFDM tone mapping 2000 one codeword 2005 to one 1024-OFDM symbol according to this disclosure. The codeword can be modulated and encoded using the same modulation and coding as in the IEEE 802.11ad standard, such as the staggered quadrature phase-shift keying (SQPSK) scheme.

As shown, the code block 2005 (e.g., 672-bit codeword) is mapped over a 1024-OFDM symbol 2010. Each pair of bits 2015 in the code block 2005 are coded and modulated using a QPSK 2020. Separately, the pair of bits 2015 are mapped to different data subcarriers 2020a, which are separate from each other by at least one function 2025 (i.e., #k and #P(k)).

Figure 21:
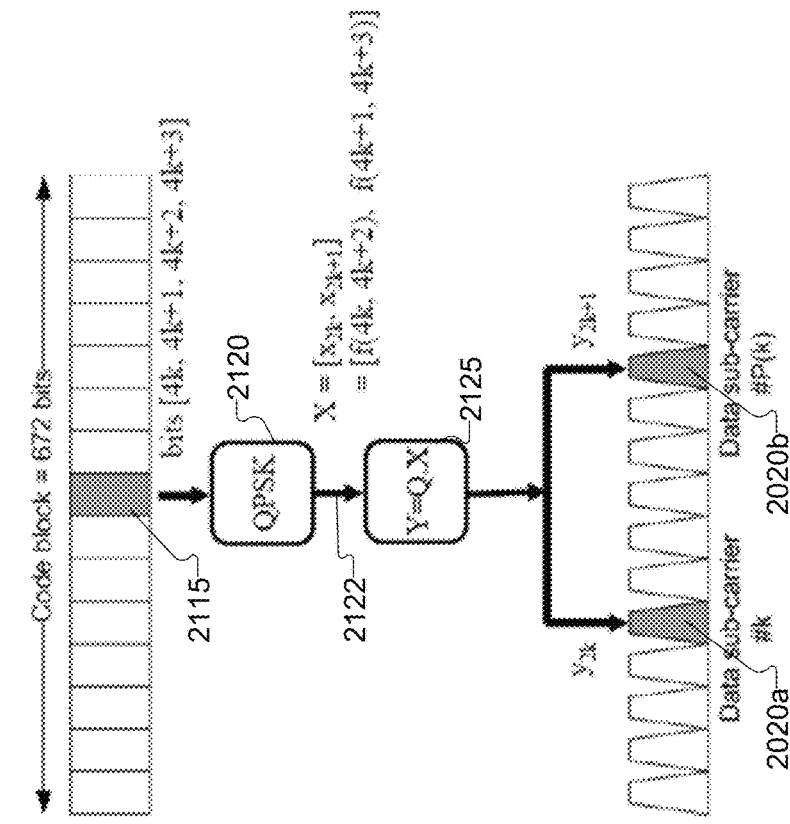
FIGS. 20 and 21 illustrate examples of OFDM tone mapping one codeword to one 1024-OFDM symbol according to this disclosure.

Although FIG. 20 illustrates an example OFDM tone mapping 2000k, various changes can be made to FIG. 20. For example, the pair of bits 2015 could be at least one pair of bits, which could include multiple pairs of bits. As a particular example, FIG. 21 shows that the at least one pair of bits 2115 includes four bits, namely the set [4k, 4k+1, 4k+2, 4k+3]. The at least one pair of bits 2115 are coded and modulated through the QPSK 2120 to generate X 2122, namely, a pair of bits to be mapped to different data subcarriers 2020a, which are separate from each other by at least one function 2125 (i.e., Y=Q·X).

Figure 22:
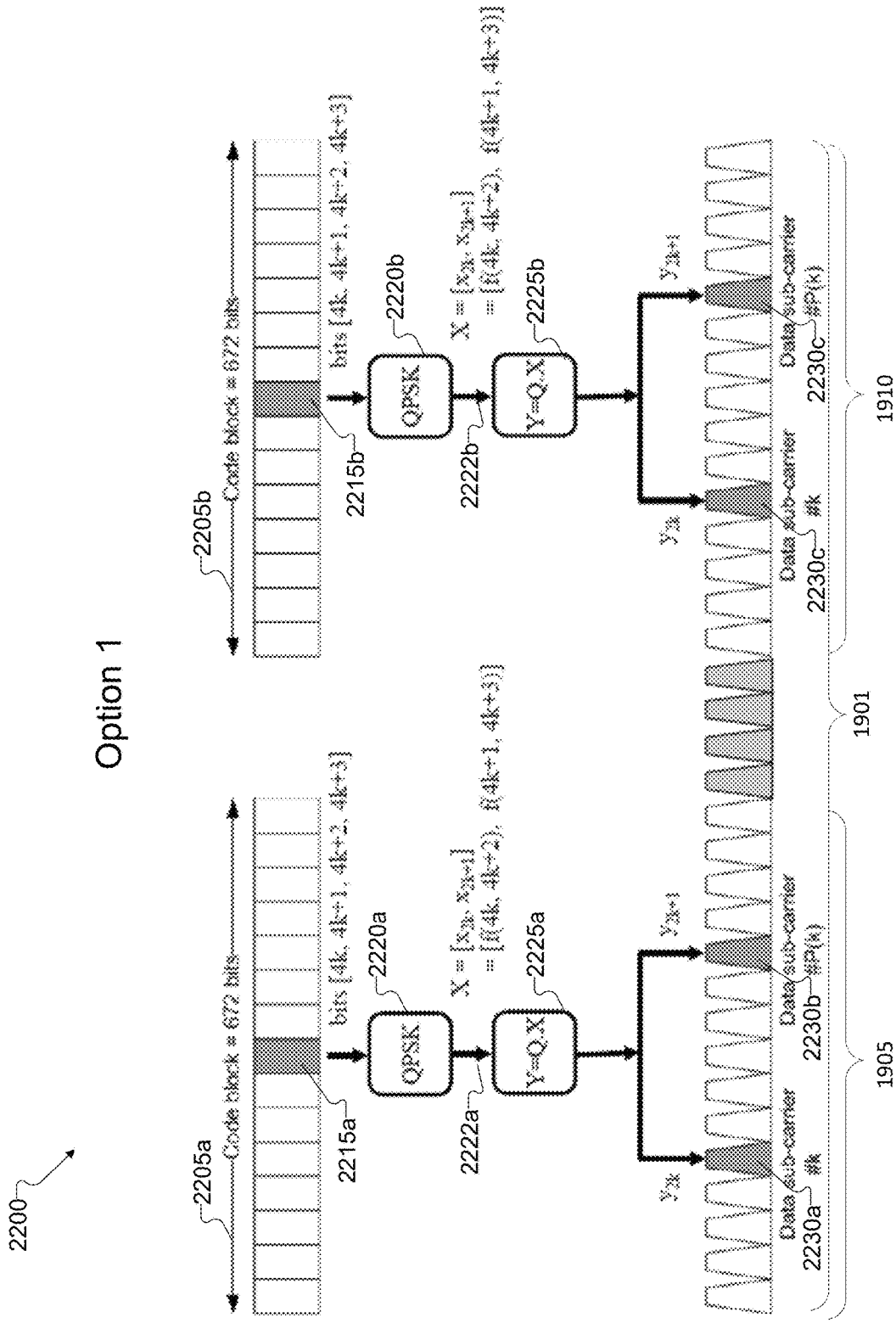
FIG. 22 illustrates an example OFDM tone mapping of two code blocks to one channel formed by two sub-channels bonded together according to this disclosure.

FIG. 22 illustrates an example OFDM tone mapping 2200 of two code blocks 2205a-2205b to one channel 1901 formed by two sub-channels 1905 and 1910 bonded together according to this disclosure. Note that the code blocks 2205a-2205b, at least one pair of bits 2215a-2215b, QPSK processing blocks 2220a-2220b, X 2222a-2222b, and sub-carrier separation functions 2225a-2222b could be the same as or similar to corresponding components 2105, 2115, 2120, 2222, and 2125 of FIG. 21.

The OFDM tone mapping 2200 corresponds to the first of the various methods of mapping described above with reference to FIG. 1. The OFDM tone mapping 2200 includes mapping a first code block 2205a over a first 1905 of the two bonded sub-channels, and mapping a second code block 2205b over a second 1910 of the two bonded sub-channels, in which case the first and second code blocks are independently coded using separate 11ad codes 2220a-2220b. The sub-carrier separation functions 2225a-2225b map the pair of bits ($y_{2k}$ and $y_{2k+1}$) to a corresponding pair of data subcarriers 2230a-2230d.

Figure 23:
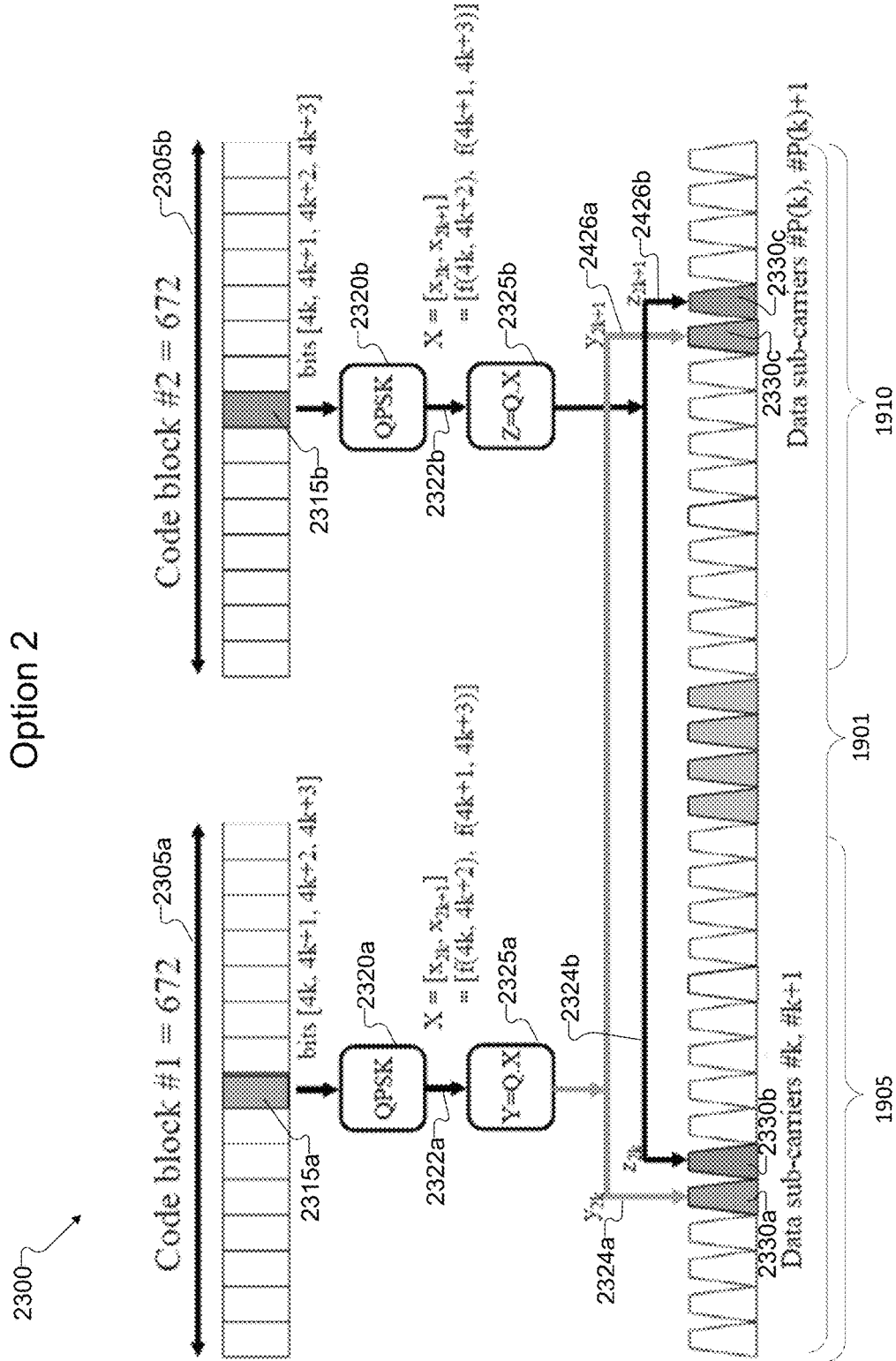
FIG. 23 illustrates an OFDM tone mapping of two code blocks to one channel formed by two sub-channels bonded together according to this disclosure.

FIG. 23 illustrates an OFDM tone mapping 2300 of two code blocks 2305a-2305b to one channel 1901 formed by two sub-channels 1905 and 1910 bonded together according to this disclosure. Note that the code blocks 2305a-2305b, at least one pair of bits 2315a-2315b, QPSK processing blocks 2320a-2320b, and X 2322a-2322b could be the same as or similar to corresponding components of FIG. 22.

The OFDM tone mapping 2300 corresponds to the second of the various methods of mapping described above with reference to FIG. 1. That is, each sub-carrier separation function 2325a-2325b is configured to interleave the respective pair of bits X 2322a-2322b among the two sub-channels 1905 and 1910. The OFDM tone mapping 2300 includes interleaving a bit $y_{2k}$ 2324a of a first code block 2305a and a bit $z_{2k}$ 2324b of a second code block 2305b over a first 1905 of the two bonded sub-channels, and more particularly mapping into the pair of data subcarriers 2330a-2330b (i.e., #k and #k+1). The OFDM tone mapping 2300 includes interleaving a pair of bits 2426a and 2426b ($y_{2k+1}$ and $z_{2k+1}$) of the first and second code blocks 2305a-2305b over a second of the two bonded sub-channels 1905, 1910, and more particularly mapping into the pair of data subcarriers 2330c-2330d (i.e., #P(k) and #P(k+1)).

Although FIG. 23 illustrates one example OFDM tone mapping of two code blocks 2305a-2305b to 2305b to one channel 1901 formed by two sub-channels 1905 and 1910 bonded together, various changes can be made to FIG. 23. For example, the quantity of 672-bit code blocks can be expanded to Zp=6 code blocks 2505a-2505f, and one or multiple pairs of bits 2515a-2515f can be coded differently according to at least two different MCSs (16-QAM or 64-QAM) and interleaved on a subcarrier basis to a set of Zp=6 subcarriers 2530a-2530f within a same sub-channel 1905 (as shown in the OFDM tone mapping 2500 of FIG. 25).

Figure 24:
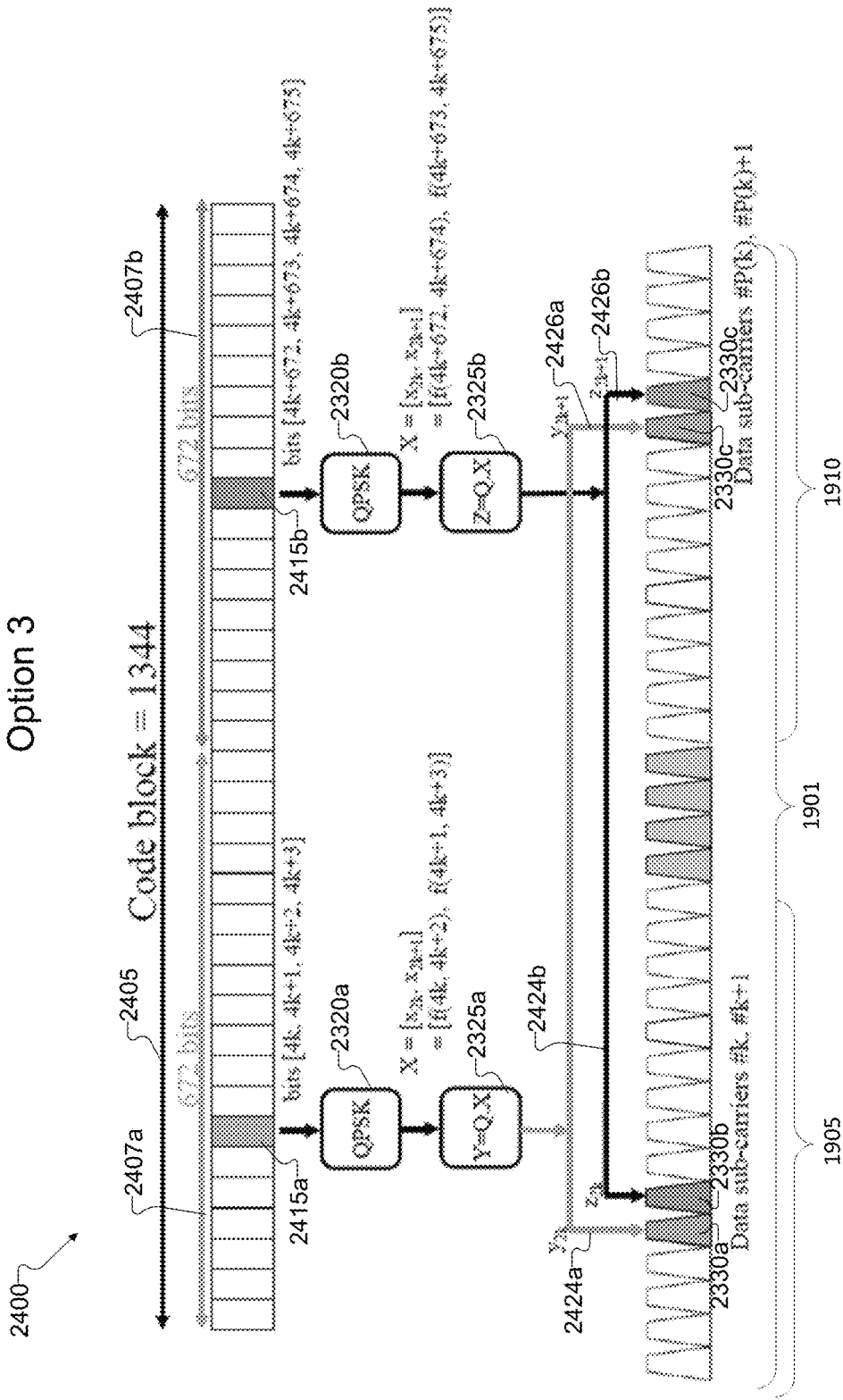
FIG. 24 illustrates an OFDM tone mapping of one codeword to one channel formed by two sub-channels bonded together according to this disclosure.
Figure 25:
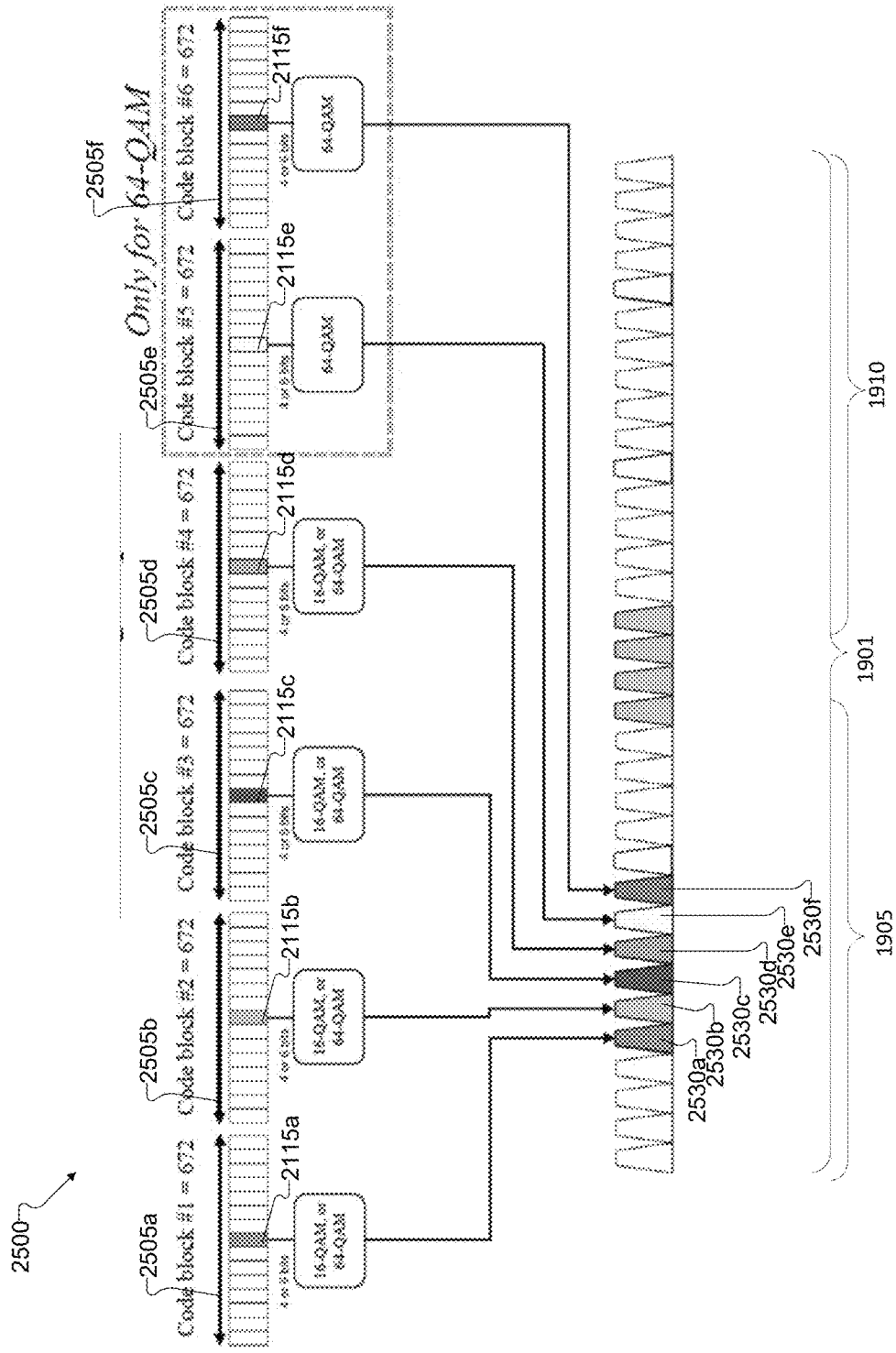
FIG. 25 illustrates an OFDM tone mapping of six code blocks to one channel formed by two sub-channels bonded together according to this disclosure.
Figure 26:
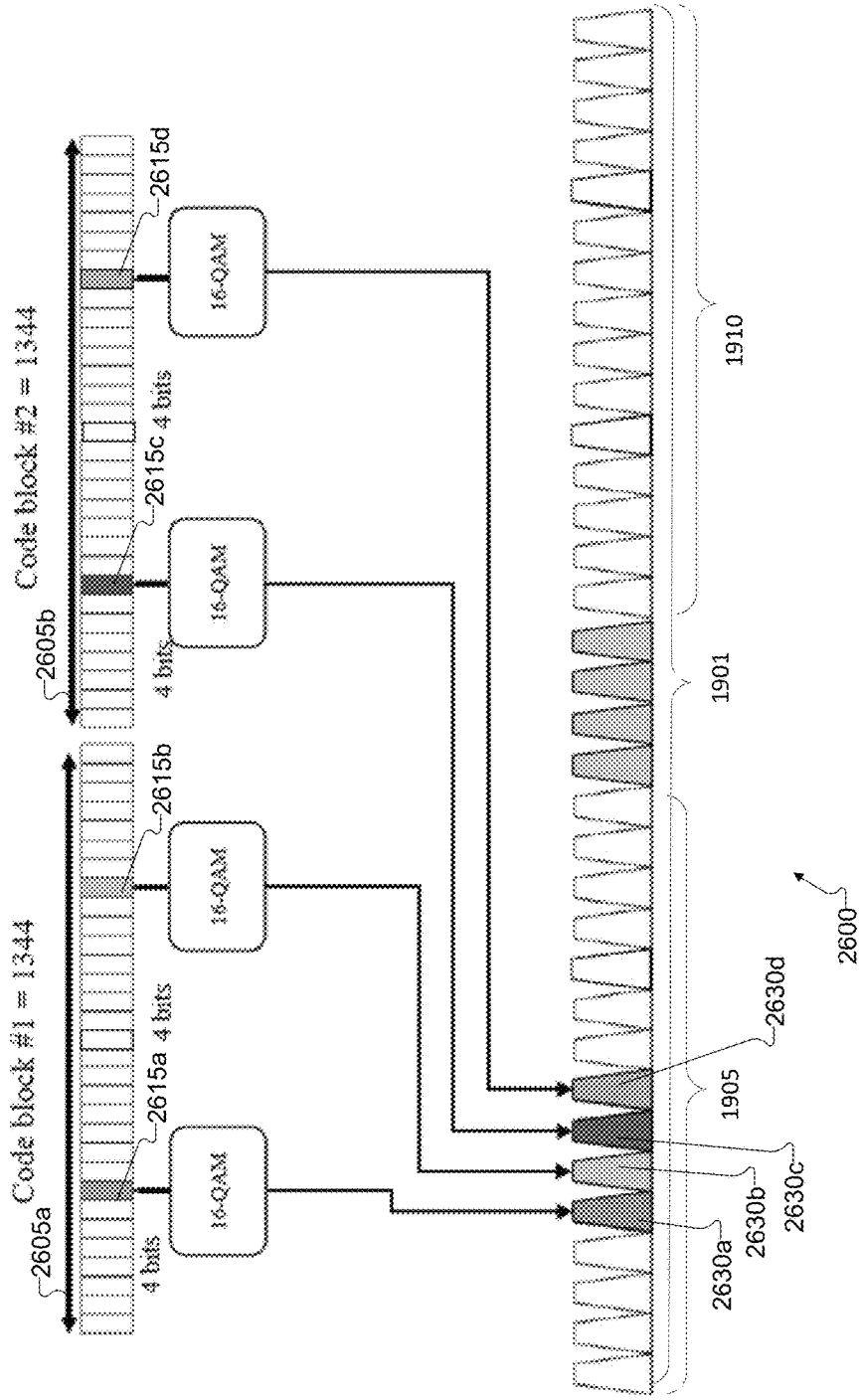
FIG. 26 illustrates an OFDM tone mapping of two codewords to one channel formed by two sub-channels bonded together according to this disclosure.
Figure 27:
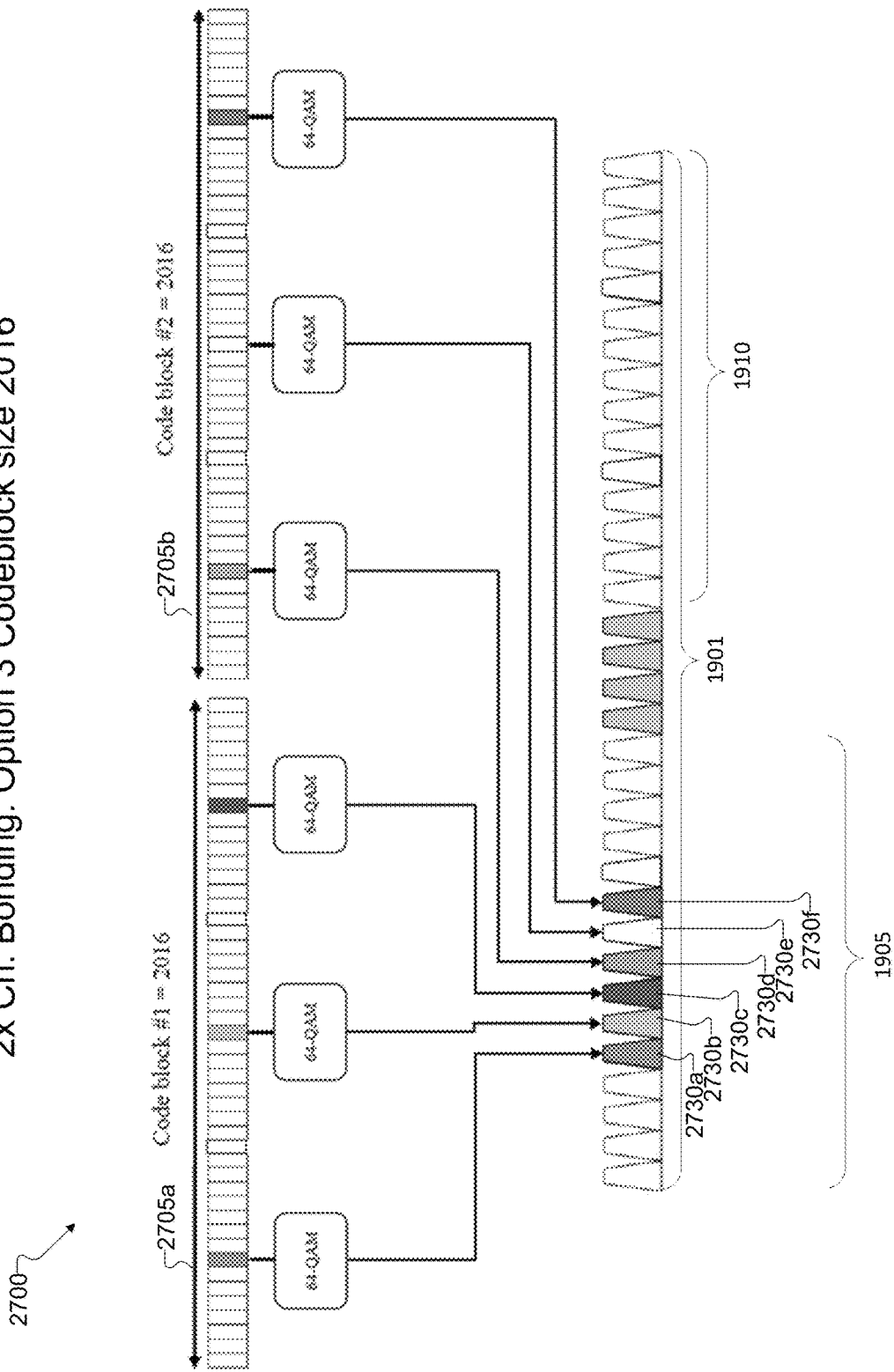
FIG. 27 illustrates an OFDM tone mapping of two 2016-length codewords to one channel formed by two sub-channels bonded together according to this disclosure.

FIGS. 24-27 illustrate additional example OFDM tone mappings. In particular, FIG. 24 illustrates an OFDM tone mapping of one codeword 2405 to one channel 1901 formed by two sub-channels 1905 and 1910 bonded together according to this disclosure; FIG. 25 illustrates an OFDM tone mapping of six code blocks 2505a-2505f to one channel 1901 formed by two sub-channels 1905 and 1910 bonded together according to this disclosure; FIG. 26 illustrates an OFDM tone mapping of two codewords 2605a and 2605b to one channel 1901 formed by two sub-channels 1905 and 1910 bonded together according to this disclosure; and FIG. 27 illustrates an OFDM tone mapping of two 2016-length codewords 2705a and 2705b to one channel 1901 formed by two sub-channels 1905 and 1910 bonded together according to this disclosure.

With specific reference to FIG. 24, the codeword 2405 includes 1344 bits, which can be evenly divided into 672-bit code block segments 2407a-2407b. Note certain components 2320a-2320b and 2325a-2325b of FIG. 23 could be included in the tone mapping of 2400 of FIG. 24. Note that at least one pair of bits 2415a-2415b, 2424a-2424b, 2426a-2426b could be the same as or similar to corresponding components of FIG. 23. The codeword 2405 is modulated and encoded/decoded using the LDPC codes for extended length code blocks (i.e., code blocks including an integer multiple of 672 quantity of bits such as 1344-length, 2016-length) according to this disclosure. The codeword 2405 can be decoded using any of the decoders of FIGS. 11-16, or encoded using a corresponding encoder.

The OFDM tone mapping 2400 corresponds to the third of the various methods of mapping described above with reference to FIG. 1. The OFDM tone mapping 2400 includes interleaving bits 2424a of a first code block segment 2407a and bits 2424b of a second code block segment 2407b over a first 1905 of the two bonded sub-channels. The OFDM tone mapping 2400 includes bits 2426a and 2426b of the first and second code block segments over a second 1910 of the two bonded sub-channels, in which case the extended length codeword 2405 (including the first and second code block segments) is coded using length-1344 or length-2016 LDPC codes according to this disclosure.

Although FIG. 24 illustrates one example OFDM tone mapping of one 1344-length codeword 2405 to one channel 1901 formed by two sub-channels 1905 and 1910 bonded together, various changes can be made to FIG. 24. For example, the quantity of 1344-bit code blocks can be expanded to Zp=2 code blocks 2605a-2605b, and one or multiple pairs of bits 2615a-2615d can be independently coded according to the same MCSs (16-QAM) and interleaved on a subcarrier basis to a set of Zp=4 consecutive subcarriers 2630a-2630d within a same sub-channel 1905 (as shown in the OFDM tone mapping 2600 of FIG. 26). As another example, the code block size can be increased. That is, the quantity of 2016-bit code blocks can be expanded to Zp=2 code blocks, and multiple pairs of bits can be independently coded according to the same MCSs (64-QAM) and interleaved on a subcarrier basis to a set of Zp=6 consecutive subcarriers 2730a-2730f within a same sub-channel 1905 (as shown in the OFDM tone mapping 2700 of FIG. 27).

Figure 28:
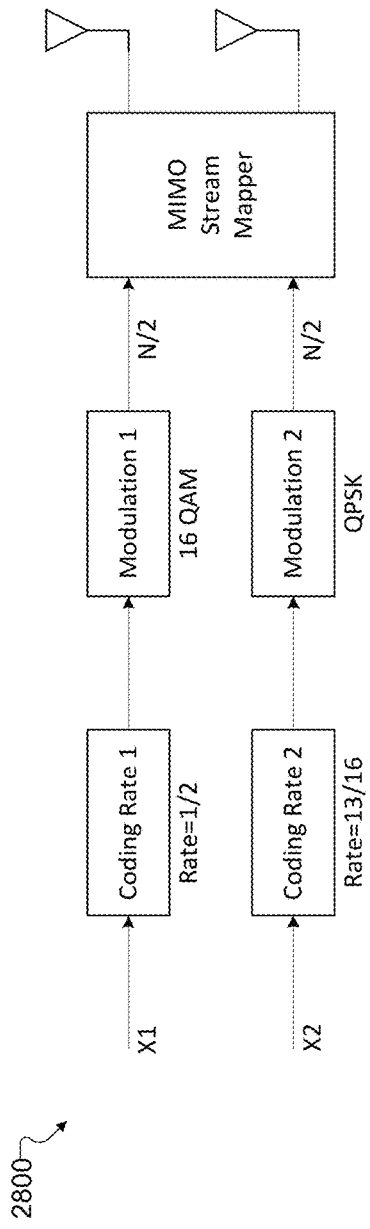
FIG. 28 illustrates a non-line of sight (NLOS) MIMO system in a mmWave system that generates and outputs feedback of one independent MCS for each MIMO stream and transmits each stream on a different MCS according to this disclosure.

FIG. 28 illustrates a non-line of sight (NLOS) MIMO system 2800 in a mmWave system that generates and outputs feedback of one independent MCS for each MIMO stream and transmits each stream on a different MCS according to this disclosure. The system 2800 includes an independent MCS for each of a plurality of MIMO stream. That is, the system 2800 includes a first modulation scheme (e.g., 16-QAM) for a first MIMO stream, and includes a second modulation scheme (e.g., QPSK) for a second MIMO stream. The MCS of a first of the MIMO stream is different from the MCS of a second of the MIMO streams.

The system 2800 includes an independent LDPC coding rate for each of the MIMO streams. That is, the system 2800 includes a first coding rate (e.g., rate 1/2) for a first MIMO stream, and includes a second coding rate (e.g., rate 13/16) for the second MIMO stream.

The system 2800 includes a MIMO stream mapper configured to map the plurality of MIMO streams to a plurality of transmit antennas. The MIMO stream mapper receives the plurality of MIMO streams, each including a code block segment having a length N/2 in the case of two MIMO streams. That is, the system 2800 can receive two different codewords (X1 and X2) or separate code block segments (X1 and X2).

Figure 29:
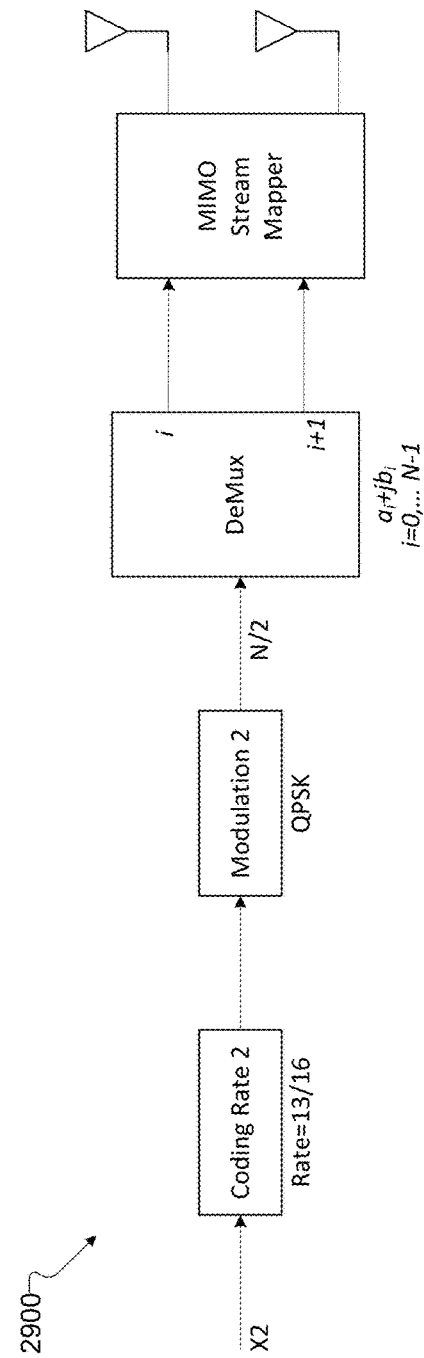
FIG. 29 illustrates a line of sight (LOS) MIMO system in a mmWave system that generates and outputs feedback of one MCS for a plurality of MIMO stream and transmits the plurality of streams using a same MCS according to this disclosure.

FIG. 29 illustrates a line of sight (LOS) MIMO system 2900 in a mmWave system that generates and outputs feedback of one MCS for a plurality of MIMO stream and transmits the plurality of streams using a same MCS according to this disclosure. Although feedback and use of different MCS for the different MIMO streams is possible, this does not provide a significant advantage over using the same MCS in the case of LOS. Interleaving of the channel codes over the MIMO streams can provide diversity gain.

The system 2900 can receive two different codewords (X1 and X2) or separate code block segments (X1 and X2). The system 2900 includes a common MCS ((e.g., QPSK) for each of a plurality of MIMO streams, and a common LDPC coding rate (e.g., 13/16) for each of the MIMO streams. The system 2900 includes a MIMO stream mapper configured to separately receive the modulated, coded plurality of MIMO streams through a demultiplexer and to map the plurality of MIMO streams to a plurality of transmit antennas.

None of the description in this application should be read as implying that any particular element, step, or function is an essential element that must be included in the claim scope. The scope of patented subject matter is defined only by the claims. Moreover, none of the claims is intended to invoke 35 U.S.C. § 112(f) unless the exact words "means for" are followed by a participle.

What is claimed is:

1. An apparatus for decoding a codeword, the apparatus comprising:
   memory configured to receive the codeword encoded based on a low-density parity check (LDPC) code H-matrix and a two-step lifting matrix; and
   processing circuitry configured to decode the received codeword,
   wherein:
      a code length of the LDPC code H-matrix lifted by the two-step lifting matrix is an integer multiple of 672 bits,
      the LDPC code H-matrix is lifted by the two-step lifting matrix based on a cyclic permutation matrix per element in the H-matrix,
      each cyclic permutation matrix is based on:
         a respective element in the H-matrix,
         an element in the two-step lifting matrix corresponding to a same address as the respective element in the H-matrix, and
         a second-level lifting factor (Zp), and
      Zp is an integer.

2. The apparatus of claim 1, wherein:
the processing circuitry further includes at least one 802.11ad decoder having a degree (D),
the memory includes a plurality of log-likelihood ratio (LLR) memory units each configured to store Z values, the LLR memory units being a quantity of Zp*D, Z being an integer equal to 672/D,
wherein the at least one 802.11ad decoder includes:
D number of gamma processors,
D number of shift registers,
a check node corresponding to each layer of the H-matrix.

3. The apparatus of claim 2, wherein the processing circuitry further includes D number of multiplexers each configured to:
receive values from groups of the LLR memory units, respectively, a quantity of each of the groups of the LLR memory units being Zp, and
selectively output Z values according to a pipeline sequence.

4. The apparatus of claim 3, wherein the processing circuitry further includes Zp number of 802.11ad decoders, among the at least one 802.11ad decoders, each of the 802.11ad decoders configured to decode in parallel with each other,
wherein each of the multiplexers includes Zp number of outputs, and
wherein each one of the Zp number of outputs of a same one of the multiplexers is coupled to provide Z values to a respective one of the Zp of 802.11ad decoders.

5. The apparatus of claim 1, wherein the processing circuitry further includes:
a Z-based input buffer configured to:
receive and buffer the codeword as a code block, which includes N input bits, and
determine that the N input bits include a number L of groups of Z bits;
output (K−1)N duplicated bits by determining;
a KZ-based LDPC decoder processing machine configured to:
receive, into a KZ shifter, L duplications of each group of Z bits, and
for each group of Z bits, decode a last of the L duplications,
output the decoded group of Z bits; and
a Z-based extrinsic buffer configured to:
buffer N decoded bits, including the number L of decoded groups of Z bits received from the KZ-based LDPC decoder, and
output the N decoded bits.

6. The apparatus of claim 1, wherein the received codeword is mapped and wherein the processing circuitry is further configured to at least one of:
demap, using orthogonal, frequency-division multiplexing (OFDM) parameters, each bit of the codeword from respective sub-carriers of a channel that spans Zp number of bonded sub-channels;
demap each of Zp number of code blocks from a corresponding sub-channel among Zp number of sub-channels bonded to form a channel by demapping a pair of bits from each of the code blocks from a pair of subcarriers in the corresponding sub-channel;
demap, by deinterleaving, bits of each of Zp number of code blocks that form the codeword from respective sub-carriers of each sub-channel of a channel that spans Zp number of bonded sub-channels, wherein each of the code blocks is encoded independently from each other code block of the codeword using a same LDPC code;
demap, by deinterleaving, bits of each of Zp number of code blocks that form the codeword from respective sub-carriers of each sub-channel of a channel that spans Zp number of bonded sub-channels, wherein each of the code blocks is encoded independently from each other code block of the codeword using at least two different LDPC codes; and
demap the codeword that includes one code block, which includes Zp multiple of groups of 672 bits, from a channel that spans Zp number of bonded sub-channels, by deinterleaving at least one pair of bits of each group of 672 bits among a corresponding at least one pair of sub-carriers in each sub-channel.

7. The apparatus of claim 1, further comprising a non-line of sight (NLOS) multi-input multi-output (MIMO) system configured to feedback one Modulation and Coding Scheme (MCS) per MIMO stream, wherein the system includes:
an independent MCS for each of a plurality of MIMO streams, wherein a MCS of a first of the MIMO streams is different from a MCS of a second of the MIMO streams, and
an independent LDPC coding rate for each of the MIMO streams; and
a MIMO stream mapper configured to map the plurality of MIMO streams to a plurality of transmit antennas.

8. The apparatus of claim 1, further comprising a line of sight (LOS) multi-input multi-output (MIMO) system configured to feedback one Modulation and Coding Scheme (MCS) per MIMO stream, wherein the system includes:
a common MCS for each of a plurality of MIMO streams, and
a common LDPC coding rate for each of the MIMO streams; and
a MIMO stream mapper configured to separately receive the modulated, coded plurality of MIMO streams through a demultiplexer and to map the plurality of MIMO streams to a plurality of transmit antennas.

9. The apparatus of claim 1, wherein:
the LDPC code H-matrix is an IEEE 802.11ad standard LDPC coding matrix; and
the two-step lifting matrix is one of a plurality of two-step lifting matrices to generate a family of LDPC codes for a plurality of code rates including 1/2, 5/8, 3/4, and 13/16 rates for both length 1344 and length 2016 LDPC codes.

10. A method for decoding a codeword, the method comprising:
receiving the codeword encoded based on a low-density parity check (LDPC) code H-matrix and a two-step lifting matrix; and
decoding the received codeword,
wherein:
a code length of the LDPC code H-matrix lifted by the two-step lifting matrix is an integer multiple of 672 bits,
the LDPC code H-matrix is lifted by the two-step lifting matrix based on a cyclic permutation matrix per element in the H-matrix, each cyclic permutation matrix is based on:
a respective element in the H-matrix,
an element in the two-step lifting matrix corresponding to a same address as the respective element in the H-matrix, and
a second-level lifting factor (Zp), and
Zp is an integer.

11. The method of claim 10, wherein:
decoding the codeword comprises decoding the codeword using processing circuitry that comprises:
at least one 802.11ad decoder having a degree (D), and D number of multiplexers;
receiving the codeword comprises receiving the codeword using a plurality of log-likelihood ratio (LLR) memory units each configured to store Z values, the LLR memory units being of a quantity of Zp*D, Z being an integer equal to 672/D;
wherein the at least one 802.11ad decoder includes:
D number of gamma processors,
D number of shift registers,
a check node corresponding to each layer of the H-matrix; and
each of the D number of multiplexers is configured to:
receive values from groups of the LLR memory units, respectively, a quantity of each of the groups of the LLR memory units being Zp, and
selectively output Z values according to a pipeline sequence.

12. The method of claim 11, wherein:
decoding the codeword further comprises decoding in parallel, by Zp number of 802.11ad decoders, among the at least one 802.11ad decoders,
wherein each of the multiplexers includes Zp number of outputs, and
wherein each one of the Zp number of outputs of a same one of the multiplexers is coupled to provide Z values to a respective one of the Zp of 802.11ad decoders.

13. The method of claim 10, wherein the received codeword is mapped and wherein decoding the received codeword comprises at least one of:
demapping, using orthogonal, frequency-division multiplexing (OFDM) parameters, each bit of the codeword from respective sub-carriers of a channel that spans Zp number of bonded sub-channels;
demapping each of Zp number of code blocks from a corresponding sub-channel among Zp number of sub-channels bonded to form a channel by demapping a pair of bits from each of the code blocks from a pair of subcarriers in the corresponding sub-channel;
demapping, by deinterleaving, bits of each of Zp number of code blocks that form the codeword from respective sub-carriers of each sub-channel of a channel that spans Zp number of bonded sub-channels, wherein each of the code blocks is encoded independently from each other code block of the codeword using a same LDPC code;
demapping, by deinterleaving, bits of each of Zp number of code blocks that form the codeword from respective sub-carriers of each sub-channel of a channel that spans Zp number of bonded sub-channels, wherein each of the code blocks is encoded independently from each other code block of the codeword using at least two different LDPC codes; and
demapping the codeword that includes one code block, which includes Zp multiple of groups of 672 bits, from a channel that spans Zp number of bonded sub-channels, by deinterleaving at least one pair of bits of each group of 672 bits among a corresponding at least one pair of sub-carriers in each sub-channel.

14. The method of claim 10, further comprising generating, by a non-line of sight (NLOS) multi-input multi-output (MIMO) system, feedback of one Modulation and Coding Scheme (MCS) per MIMO stream, wherein the system includes:
an independent MCS for each of a plurality of MIMO streams, wherein a MCS of a first of the MIMO streams is different from a MCS of a second of the MIMO streams, and
an independent LDPC coding rate for each of the MIMO streams; and
a MIMO stream mapper configured to map the plurality of MIMO streams to a plurality of transmit antennas.

15. The method of claim 10, further comprising generating, by a line of sight (LOS) multi-input multi-output (MIMO) system, feedback of one Modulation and Coding Scheme (MCS) per MIMO stream, wherein the system includes:
a common MCS for each of a plurality of MIMO streams, and
a common LDPC coding rate for each of the MIMO streams; and
a MIMO stream mapper configured to separately receive the modulated, coded plurality of MIMO streams through a demultiplexer and to map the plurality of MIMO streams to a plurality of transmit antennas.

16. An apparatus for encoding a codeword, the apparatus comprising:
memory configured to store information bits to be encoded into the codeword; and
processing circuitry configured to encode the codeword based on based on a low-density parity check (LDPC) code H-matrix and a two-step lifting matrix,
wherein:
a code length of the LDPC code H-matrix lifted by the two-step lifting matrix is an integer multiple of 672 bits,
the LDPC code H-matrix is lifted by the two-step lifting matrix based on a cyclic permutation matrix per element in the H-matrix;
each cyclic permutation matrix is based on:
a respective element in the H-matrix,
an element in the two-step lifting matrix corresponding to a same address as the respective element in the H-matrix, and
a second-level lifting factor (Zp); and
Zp is an integer.

17. The apparatus of claim 16, wherein the processing circuitry is further configured to:
determine Zp number of 672-bit code block segments of the codeword,
for each code block segment, map at least one pair of bits to a corresponding at least one pair of sub-carriers, wherein the mapping includes at least one of:
mapping, using orthogonal, frequency-division multiplexing (OFDM) parameters, each bit of the codeword to respective sub-carriers of a channel that spans Zp number of bonded sub-channels;
mapping each of Zp number of code blocks to a corresponding sub-channel among Zp number of sub-channels bonded to form a channel by mapping a pair of bits from each of the code blocks to a pair of subcarriers in the corresponding sub-channel;
mapping, by interleaving, bits of each of Zp number of code blocks that form the codeword to respective sub-carriers of each sub-channel of a channel that spans Zp number of bonded sub-channels, wherein each of the code blocks is encoded independently from each other code block of the codeword using a same LDPC code;

mapping, by interleaving, bits of each of Zp number of code blocks that form the codeword to respective sub-carriers of each sub-channel of a channel that spans Zp number of bonded sub-channels, wherein each of the code blocks is encoded independently from each other code block of the codeword using at least two different LDPC codes; and mapping the codeword that includes one code block, which includes Zp multiple of groups of 672 bits, to a channel that spans Zp number of bonded sub-channels, by interleaving at least one pair of bits of each group of 672 bits among a corresponding at least one pair of sub-carriers in each sub-channel.

18. The apparatus of claim 16, wherein:

the LDPC code H-matrix is an IEEE 802.11ad standard LDPC coding matrix; and the two-step lifting matrix is one of a plurality of two-step lifting matrices to generate a family of LDPC codes for a plurality of code rates including 1/2, 5/8, 3/4, and 13/16 rates for both length 1344 and length 2016 LDPC codes.

\* \* \* \* \*